United States Patent
Chinda et al.

(10) Patent No.: US 8,230,591 B2
(45) Date of Patent: Jul. 31, 2012

(54) METHOD FOR FABRICATING AN ELECTRONIC DEVICE SUBSTRATE

(75) Inventors: Akira Chinda, Tokyo (JP); Nobuaki Miyamoto, Tokyo (JP); Koki Hirasawa, Kanagawa (JP); Kenji Uchida, Kanagawa (JP); Mamoru Mita, Hitachi (JP)

(73) Assignees: Hitachi Cable, Ltd., Tokyo (JP); Renesas Electronics Corporation, Kawasaki-shi (JP)

( * ) Notice: Subject to any disclaimer, the term of this patent is extended or adjusted under 35 U.S.C. 154(b) by 1009 days.

(21) Appl. No.: 12/081,538

(22) Filed: Apr. 17, 2008

(65) Prior Publication Data

US 2008/0201943 A1    Aug. 28, 2008

Related U.S. Application Data

(62) Division of application No. 11/376,556, filed on Mar. 16, 2006, now abandoned.

(30) Foreign Application Priority Data

Mar. 17, 2005  (JP) .................................. 2005-076674
Oct. 3, 2005   (JP) .................................. 2005-290463

(51) Int. Cl.
    *H05K 3/02*    (2006.01)
(52) U.S. Cl. ................ 29/846; 29/830; 29/832; 29/852; 438/110; 438/111; 438/112
(58) Field of Classification Search ................... 29/825, 29/830, 832, 840, 852; 257/691; 438/110, 438/111, 112
See application file for complete search history.

(56) References Cited

U.S. PATENT DOCUMENTS

| | | | |
|---|---|---|---|
| 5,822,856 A * | 10/1998 | Bhatt et al. ...................... | 29/832 |
| 6,001,671 A * | 12/1999 | Fjelstad ........................ | 438/112 |
| 6,339,261 B1 | 1/2002 | Yonemochi et al. | |
| 6,346,335 B1 | 2/2002 | Chen et al. | |
| 6,495,909 B2 | 12/2002 | Jung et al. | |
| 6,498,099 B1 * | 12/2002 | McLellan et al. ............. | 438/689 |
| 6,514,847 B1 | 2/2003 | Ohsawa et al. | |
| 6,569,543 B2 | 5/2003 | Brenneman et al. | |
| 6,635,957 B2 * | 10/2003 | Kwan et al. ................... | 257/691 |
| 6,689,268 B2 | 2/2004 | Chen et al. | |
| 6,700,188 B2 | 3/2004 | Lin | |
| 6,872,661 B1 * | 3/2005 | Kwan et al. ................... | 438/689 |

(Continued)

FOREIGN PATENT DOCUMENTS

CN         1323695 A        11/2001
(Continued)

OTHER PUBLICATIONS

T. Osawa et al., "Science and Application of Soldering, Chapter 4.3 Coating," Kogyo Chosakai Publishing, Inc., 2000, pp. 101-113.

(Continued)

*Primary Examiner* — Carl Arbes
(74) *Attorney, Agent, or Firm* — Foley & Lardner LLP

(57) ABSTRACT

An electronic device substrate is provided with a thin-plate core substrate; a metal electrode provided on the core substrate and electrically connected to an electrode of an electronic component to be packaged thereon; and an electrical insulation layer on which is mounted the electronic component, and which is provided to surround the metal electrode.

14 Claims, 18 Drawing Sheets

U.S. PATENT DOCUMENTS

| | | | |
|---|---|---|---|
| 6,933,594 B2 * | 8/2005 | McLellan et al. | 257/676 |
| 6,946,324 B1 * | 9/2005 | McLellan et al. | 438/111 |
| 6,989,294 B1 * | 1/2006 | McLellan et al. | 438/111 |
| 6,995,460 B1 * | 2/2006 | McLellan et al. | 257/676 |
| 7,064,011 B2 | 6/2006 | Ikenaga et al. | |
| 7,115,989 B2 | 10/2006 | Hosokawa | |
| 7,132,158 B2 | 11/2006 | Brenneman et al. | |
| 7,205,178 B2 * | 4/2007 | Shiu et al. | 438/110 |
| 7,214,326 B1 * | 5/2007 | Yang et al. | 216/13 |
| 7,226,811 B1 * | 6/2007 | McLellan et al. | 438/111 |
| 7,270,867 B1 * | 9/2007 | Kwan et al. | 428/111 |
| 7,271,032 B1 * | 9/2007 | McLellan et al. | 438/111 |
| 2001/0014538 A1 | 8/2001 | Kwan et al. | |
| 2004/0169275 A1 | 9/2004 | Danvir et al. | |
| 2009/0211796 A1 | 8/2009 | Chinda et al. | |

FOREIGN PATENT DOCUMENTS

| | | | |
|---|---|---|---|
| CN | 1591809 A | | 3/2005 |
| JP | 03-094459 A | | 4/1991 |
| JP | 03-099456 A | | 4/1991 |
| JP | 05-167227 A | | 2/1993 |
| JP | 09-252014 A | | 9/1997 |
| JP | 2002-009196 A | | 1/2002 |
| JP | 2002-158313 A | | 5/2002 |
| JP | 2002-275435 A | | 9/2002 |
| JP | 2005-005435 A | | 1/2005 |
| JP | 2005-072343 A | | 3/2005 |
| KR | 1998-20727 A | | 6/1998 |

OTHER PUBLICATIONS

T. Ozaki et al., "Super Thin Copper Leaf of 1~5μm w/Carrier for High Definition, High Density Wiring Board," Electronic Materials, Oct. 2004, pp. 76-80.

A. Chinda, US PTO Office Action, U.S. Appl. No. 11/376,556, dated Dec. 30, 2008, 14 pgs.

A. Chinda, US PTO Office Action, U.S. Appl. No. 11/376,556, dated Mar. 17, 2008, 9 pgs.

A. Chinda, US PTO Office Action, U.S. Appl. No. 11/376,556, dated Jun. 9, 2008, 11 pgs.

\* cited by examiner

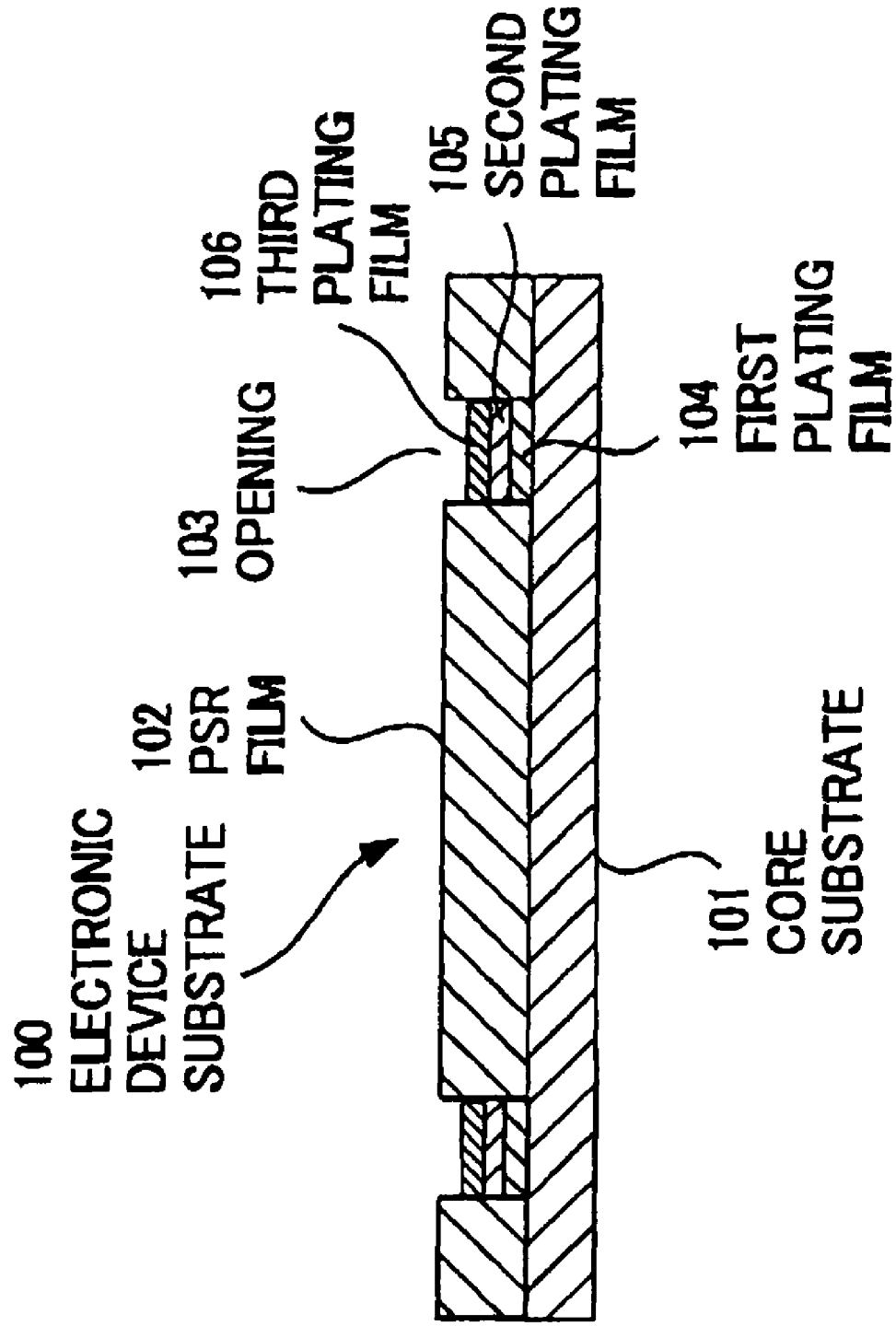

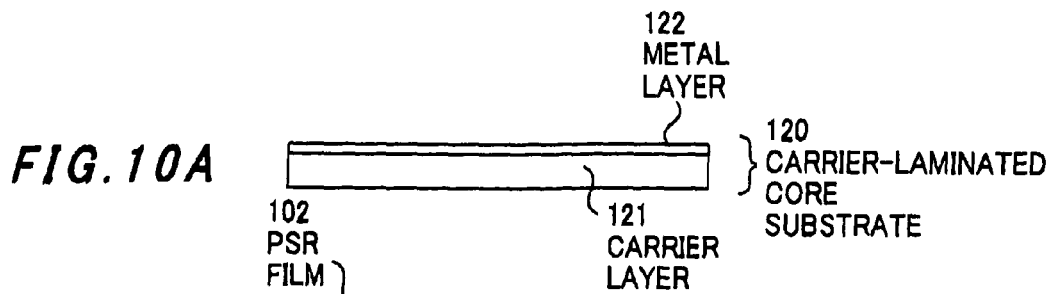
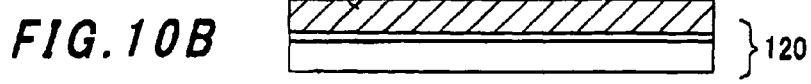
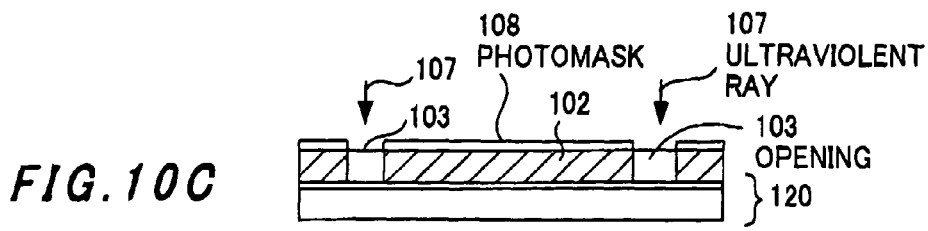
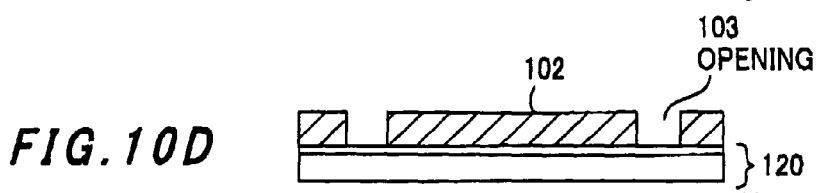
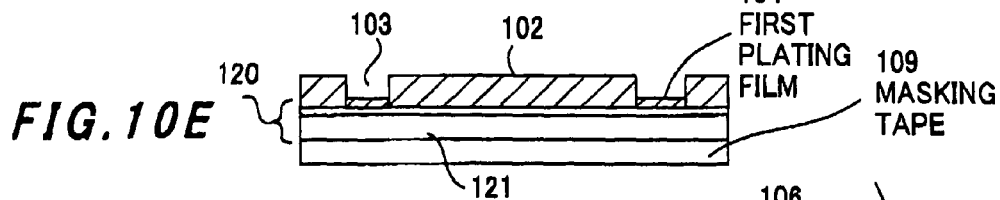
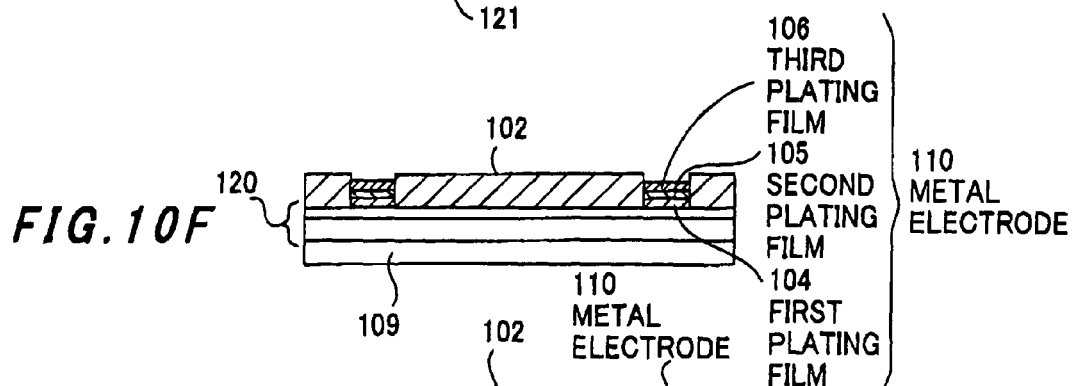
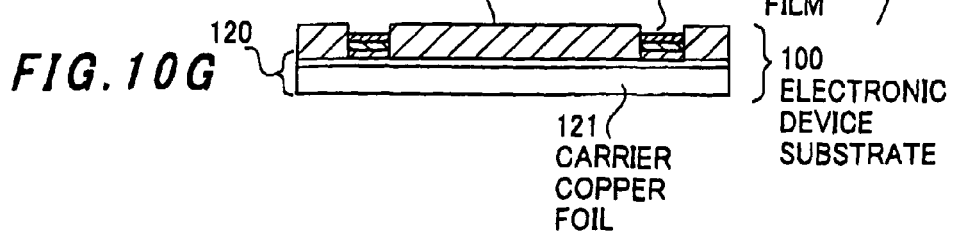

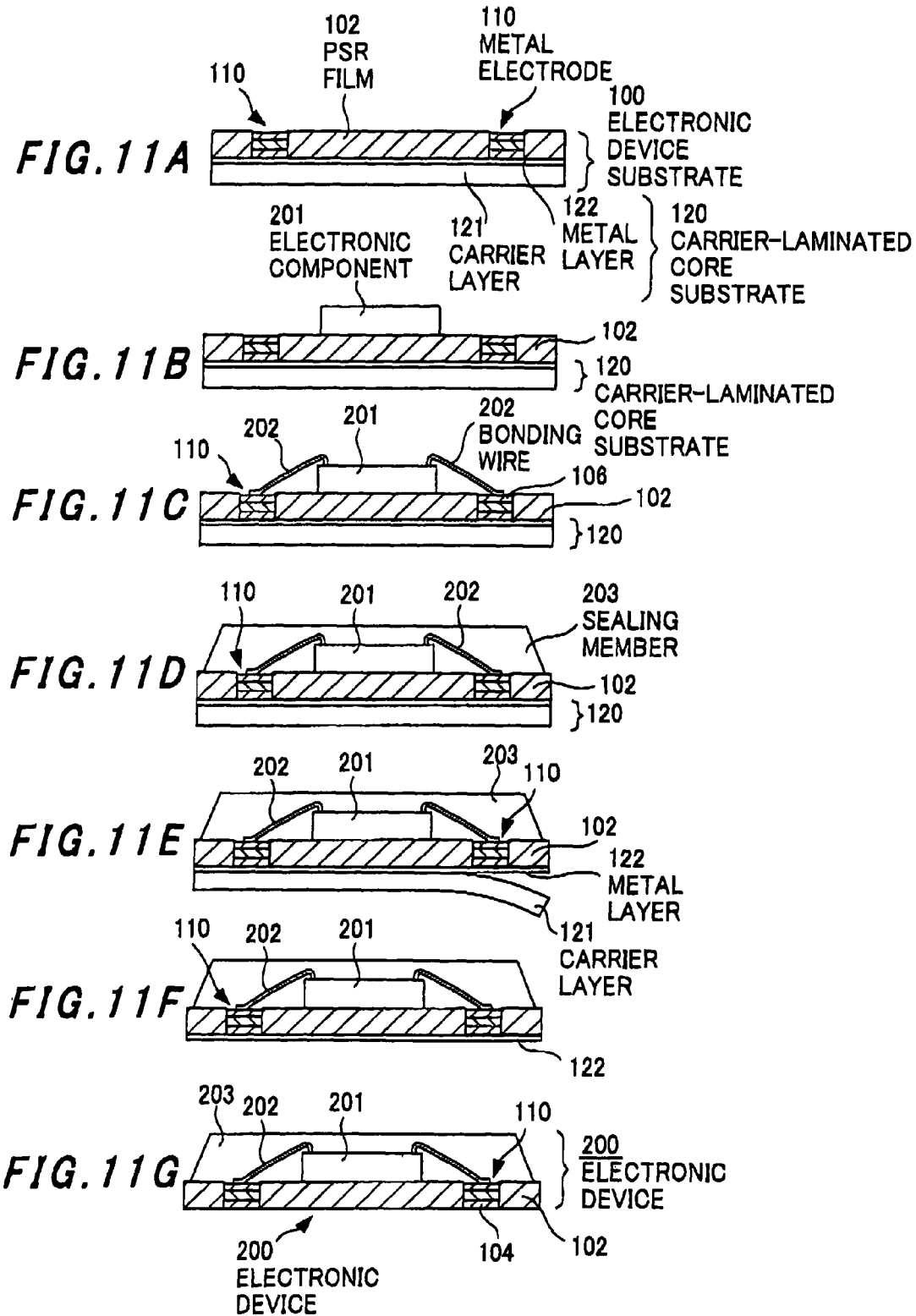

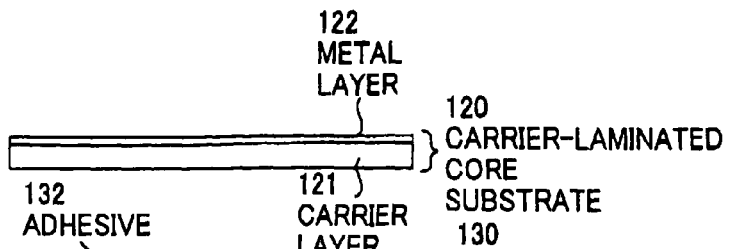
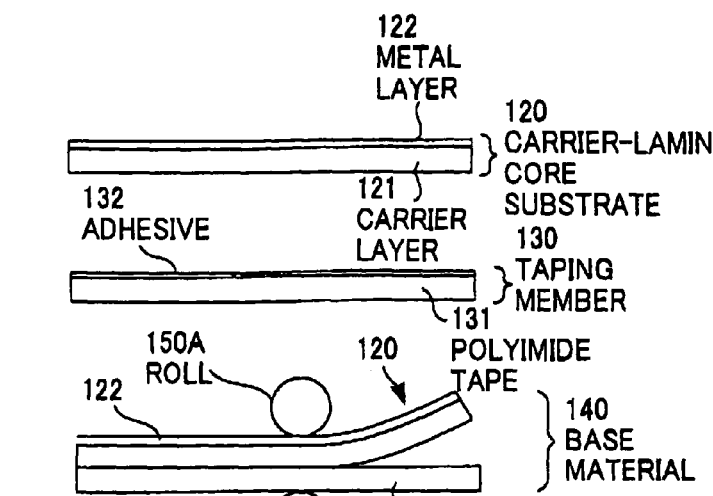
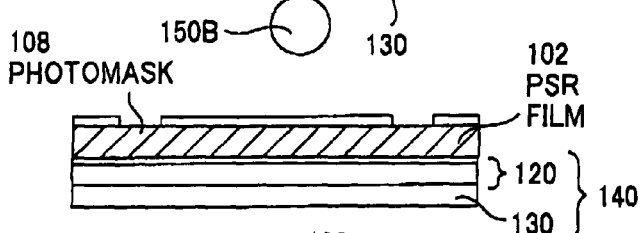
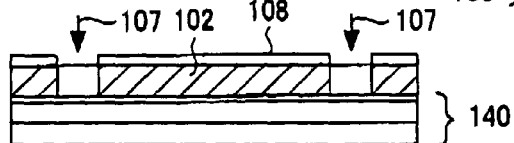
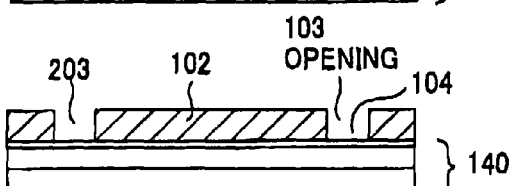
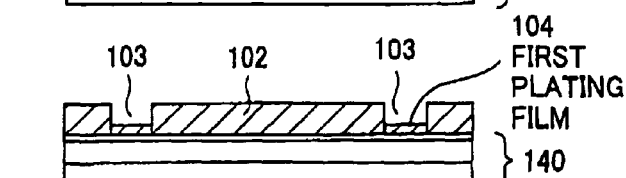
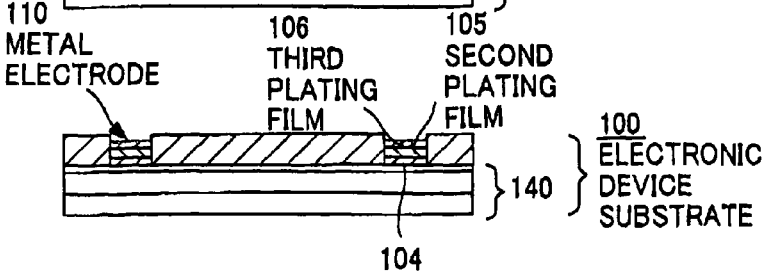

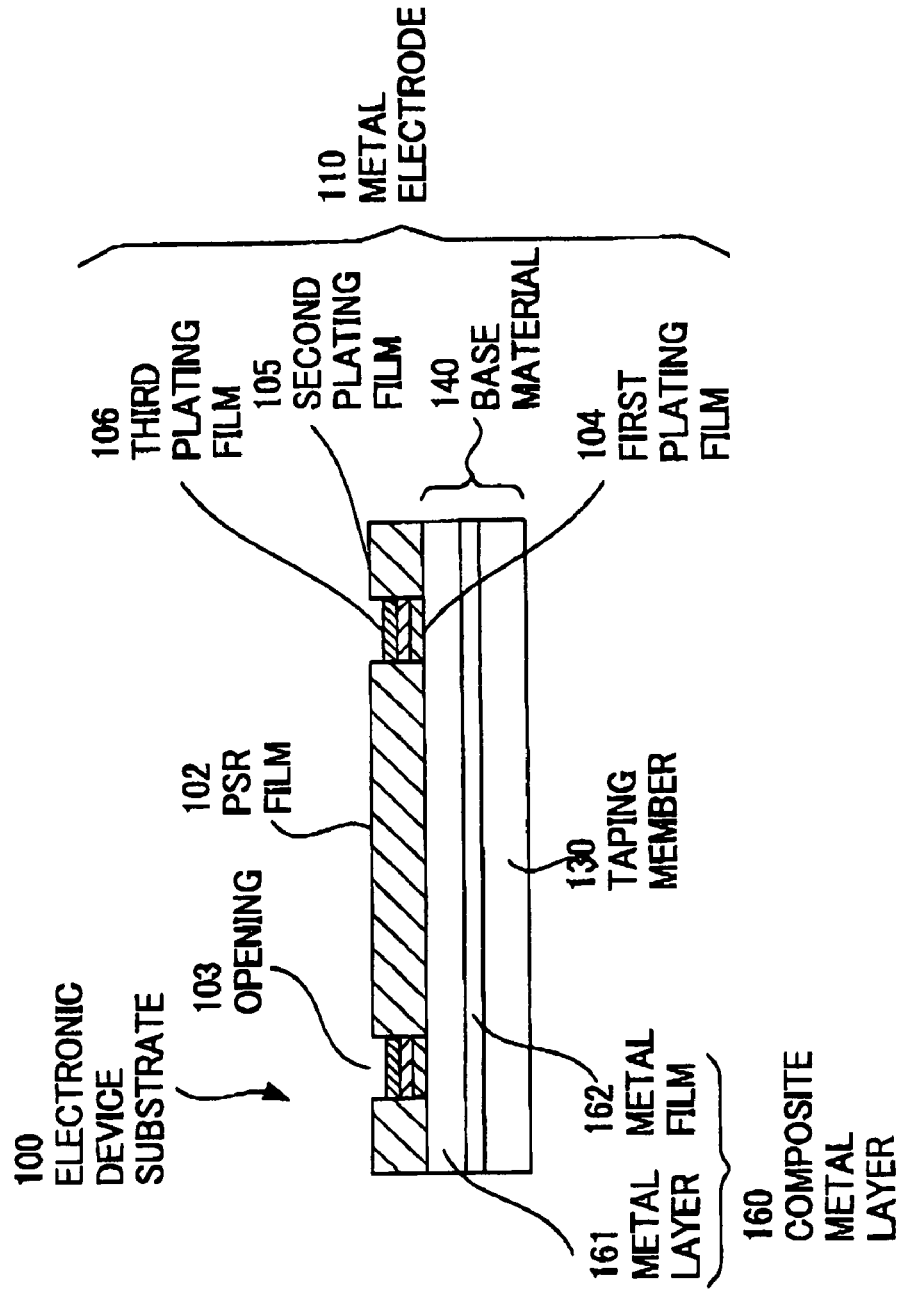

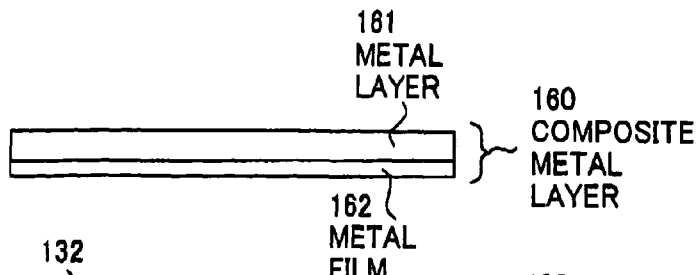
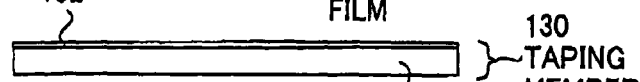
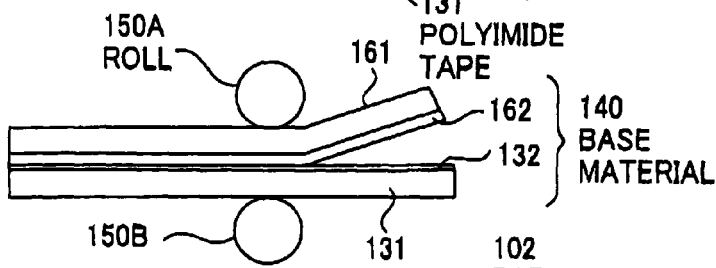
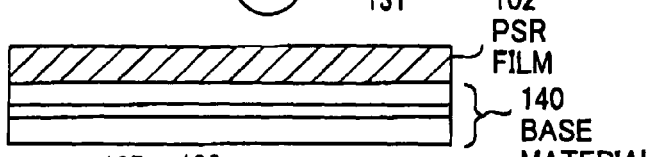
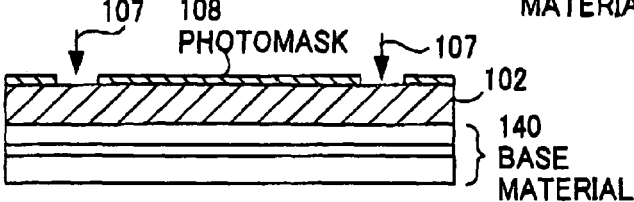
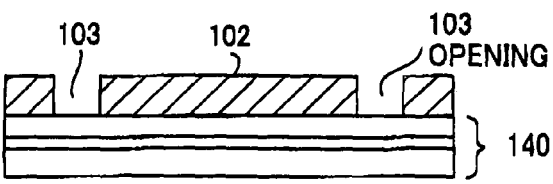
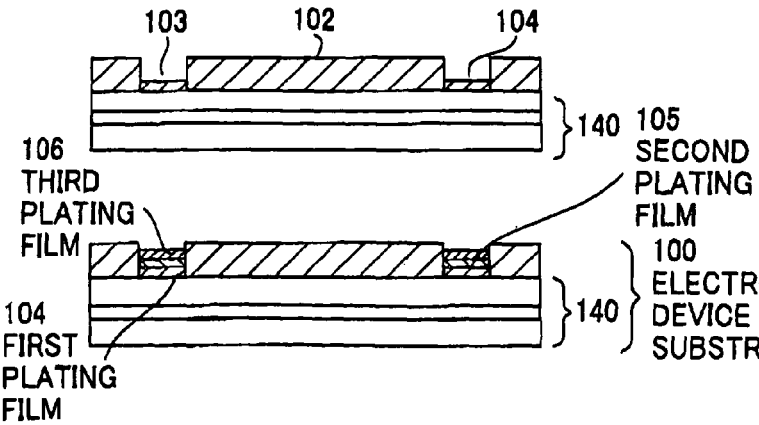
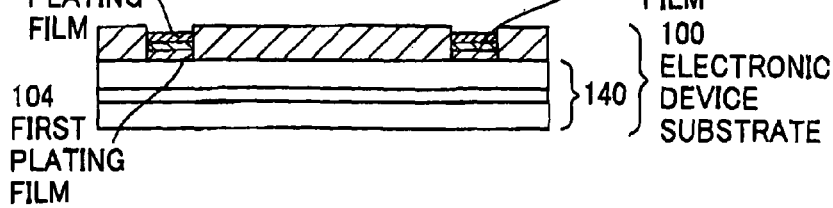

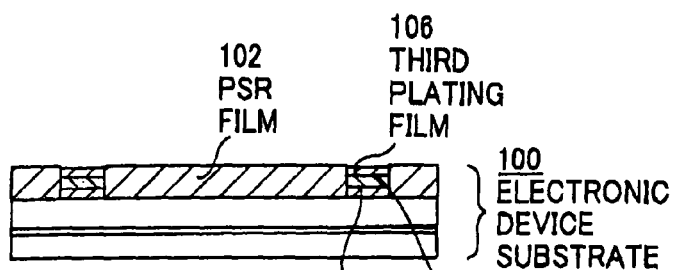
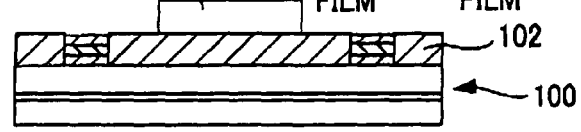
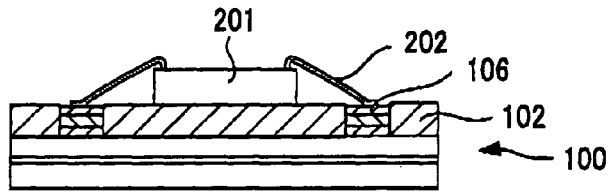
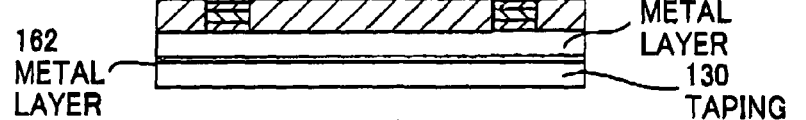
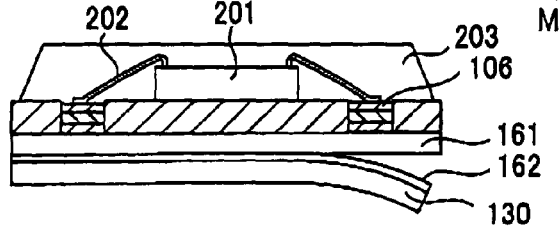
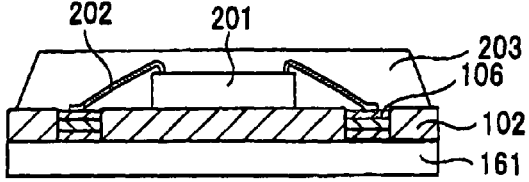
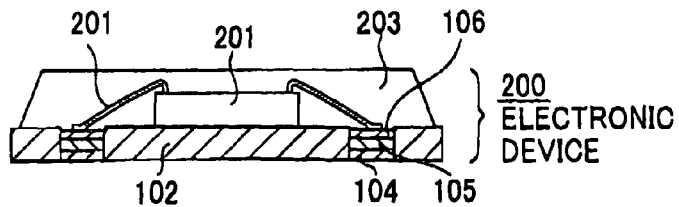

METHOD FOR FABRICATING AN ELECTRONIC DEVICE SUBSTRATE

The present application is a divisional of U.S. application Ser. No. 11/376,556, filed Mar. 16, 2006, the entire contents of which is incorporated herein by reference.

The present application is based on Japanese patent application Nos. 2005-76674 and 2005-290463, the entire contents of which are incorporated herein by reference.

BACKGROUND OF THE INVENTION

1. Field of the Invention

The present invention relates to an electronic device substrate and its fabrication method, and an electronic device and its fabrication method. Particularly, it relates to an electronic device substrate and its fabrication method, and an electronic device and its fabrication method, which is capable of releasing a core substrate from an electronic device substrate side with weak force, reducing the load of chemical or electrochemical dissolution, or mechanical grinding for exposing a terminal surface to a lower surface, and reducing size.

2. Description of the Related Art

FIGS. 1A and 1B are respectively a front cross-sectional view and a plan view showing an electronic component mount surface of a conventional electronic device. This electronic device 1 comprises a wiring board 2 having through-holes 3, a die pad 4 provided on the wiring board 2, plural wiring patterns 5 each having a metal electrode 5a and an internal connection terminal 5b at both ends and provided on the wiring board 2, an electronic component 6 mounted on the die pad 4 by conductive paste bonding, plural external electrode pads 7 connected to respective lower ends of the through-holes 3 and provided in the lower surface of the wiring board 2, ball-shaped external connection terminals 8 provided respectively for the external electrode pads 7, metallic bonding wires 9 connecting terminals 6a of the electronic component 6 and the internal connection terminal 5b, and a sealing resin 10 provided at the upper surface of the wiring board 2 for covering the electronic component 6 and the bonding wires 9.

The wiring board 2 uses a glass epoxy resin, a polyimide tape, or the like.

The through-holes 3 comprises a conductive body for electrical conduction between the metal electrode 5a and the external electrode pads 7. The die pad 4, wiring pattern 5, and external electrode pads 7 comprise copper foil formed by photochemical etching.

The through-holes 3, die pad 4, wiring pattern 5, and external electrode pads 7 are copper-plated, nickel-base-plated, or gold-plated on an inner surface or on a front surface by electrical or electroless plating.

The electronic device 1 is completed by first mounting the electronic component 6 on the die pad 4 of the wiring board 2, connecting terminals 6a of the electronic component 6 and the internal connection terminal 5b, and sealing with the sealing resin 10 such as an epoxy resin. Typically, finally, spherical external connection terminals 8 such as a solder ball are attached to the external electrode pads 7.

Also, recently, a coreless electronic device that uses no module substrate (hereinafter, a coreless package) has been proposed. For instance, a coreless electronic device is known that die-bonds an electronic component on a base film and wire-bonds between it and a metal base, followed by etching of unwanted portions of the metal base for exposing a terminal and a mount portion (See JP-A-3-94459).

FIG. 2 shows structure of a coreless package, as shown in JP-A-3-94459. This coreless package 20 has the configuration in which the wiring board 2 as an electrical insulative core substrate is removed in FIG. 1, and the backsides of the die pad 4 and wiring pattern 5 are exposed to the package bottom.

Also, as an example of a coreless package with plural electronic components, as shown in JP-A-3-99456, it is known that the plural electronic components and a circuit pattern are connected by wire-bonding, which are integrally sealed with resin, and a protective coating is applied to the bottom of the electronic component package, and the circuit pattern exposed from of an opening of this protective coating is gold-plated for preventing corrosion.

FIGS. 3A-3E show a fabrication method of the coreless package 20 of FIG. 2. First, as in FIG. 3A, there are formed a die pad 4, and plural wiring patterns 5 each having a metal electrode 5a and an internal connection terminal 5b on an electrical insulative transfer film 21 as a core substrate.

Subsequently, as shown in FIG. 3B, an electronic component 6 is mounted on the die pad 4, and as shown in FIG. 3C, this is followed by connecting terminals of the electronic component 6 and the internal connection terminal 5b with bonding wires 9.

Next, as shown in FIG. 3D, the electronic component 6 is sealed with sealing resin 10, followed by removal of the transfer film 21. which results in the coreless package 20, as shown in FIG. 3E. This method transfers a wiring conductor to the sealing resin 10, and is therefore called a transfer method.

As a fabrication method of a coreless package by transferring, a method is known that uses a thick base material instead of a transfer film (see for example, JP-A-9-252014). This method laminates metal foil on the base material, packages and wire-bonds an electronic component on the metal foil, followed by resin sealing and subsequent separation of the resin from the base material.

Further, as an analogous known example of a coreless package transfer method, as shown in JP-A-2002-9196, a fabrication method of a semiconductor device is known that dissolves a metal base positioned in a lower surface. This method fabricates an electronic device by forming a resist pattern in the metal base of a core substrate, forming an opening in a die bonding portion and a portion corresponding to the bonding portion of the resist pattern, and filling the opening with nickel plating, followed by metal plating of its surface, removal of the resist pattern, mounting of an electronic component in the bonding portion, wire-bonding on a gold plating film as the bonding portion, resin sealing thereof, and etching of the metal base.

The conductors such as the die pad, internal connection terminal, wiring pattern, external connection electrode, etc. are formed by photochemical etching of copper foil typically using electrolytic copper foil, rolled copper foil, etc.

FIG. 4 shows structure of a transfer film of FIG. 3. As shown in FIG. 4, this transfer film 21 is provided with an adhesive 22 coated thereover, a die pad 4 and a wiring pattern 5 formed on the adhesive 22, and functional plating 23 applied to the surface of the die pad 4 and the wiring pattern 5.

The functional plating 23 is provided for good connection between a terminal of the electronic component 6 and a metal electrode 5a. This functional plating 23 comprises electroless or electrical nickel plating as base plating, and electroless or electrical gold plating provided thereon.

Typically, the electrical nickel plating is in the thickness range of 0.5-2.0 μm depending on heating conditions in electronic component mounting and wire bonding. Also, the base nickel plating serves as a thermal diffusion prevention film (a barrier film) into the gold plating film of the copper. The gold plating is applied to a surface layer because of high connection reliability of ultrasonic wire-bonding. To enhance wire-bonding, the thicker the better, but the optimal thickness is selected in the range of 0.1-2.0 μm taking account of productivity and cost.

According to the conventional electronic device, in the configuration of FIG. 4, however, there is the problem with very poor adhesion of the gold plating in the functional plating 23 to sealing resin 10. Specifically, when gold plating is applied to the surface of the functional plating 23, the gold does not form a high electronegativity oxide film, which results in poor adhesion to the sealing resin, and degrades reliability of the electronic device.

Also, as shown in FIG. 3, in the fabrication of the coreless package 20, the transfer film 21 is released in a final step, but it is released with the component of the adhesive 22 applied to the transfer film 21 adhering to the backside of the metal electrode 5a, or the transfer film 21 is torn without being completely released.

To avoid this failure, JP-A-2002-9196 describes a method connecting the metal base of the core substrate and the electrode with poor adhesive metals. However, even this method cannot entirely avoid the following:

(1) The first is that because an external electrode portion exposed after releasing the transfer film (core substrate) 21 generally comprises copper or nickel, a terminal portion exposed after releasing must be cleaned with acid, and then coated with electroless gold or tin plating.

(2) The second is that when the bond strength between the transfer film 21 and wiring pattern 5 is stronger than that between the sealing resin 10 and wiring pattern 5, when the transfer film (core substrate) 21 is released, it often slips off the sealing resin 10 with the wiring pattern 5 bonded to the transfer film 21.

To avoid this failure, JP-A-2002-9196 also describes a method thickening the metal of the wiring pattern and fabrication on a periphery an overhanging portion that slightly projects on its sealing resin side, but because the thickness of the wiring pattern is increased, the plating time is long, or the resist film must be removed with a canopy shape held, so that because of these steps, the distance between the adjacent electrodes cannot be reduced, which results in an increase of electronic device dimensions.

On the other hand, in the case of a single layer of the metal of the base of the core substrate, because mechanical durability is required in carrying and fabrication, its thickness needs to be generally 20 μm or more. For that reason, when this is removed by chemical dissolution or mechanical grinding, the processing time is long because of the thickness, which results in a large load of the chemical dissolution or mechanical grinding for exposing a terminal surface from the package backside.

Also, when the metal base is released by applying mechanical stress, the package is curved or cracked by the stress which is an obstacle particularly in forming a thin electronic device.

SUMMARY OF THE INVENTION

Accordingly, it is an object of the present invention to provide an electronic device substrate and its fabrication method, and an electronic device and its fabrication method, which is capable of releasing a core substrate from an electronic device substrate side with weak force, reducing the load of chemical or electrochemical dissolution, or mechanical grinding for exposing a terminal surface to a lower surface, and reducing size.

(1) According to one aspect of the invention, an electronic device substrate comprises:
  a thin-plate core substrate;
  a metal electrode provided on the core substrate and electrically connected to an electrode of an electronic component to be packaged thereon; and
  an electrical insulation layer provided to surround the metal electrode.

In the above invention (1), the following modifications and changes can be made.
  (a) The core substrate comprises any of copper foil, stainless foil, aluminum or aluminum alloy foil, nickel or nickel alloy foil, or tin or tin alloy foil.
  (b) The core substrate comprises a carrier layer formed of a metal as raw material, a release layer formed over the carrier layer, and a metal layer formed over the release layer, and the metal layer is arranged on the electrical insulation layer side.
  (c) The metal layer has the smaller bond strength between the metal layer and the carrier layer via the release layer than the bond strength between the metal layer and the electrical insulation layer.
  (d) The release layer comprises an organic-based or inorganic-based release layer.
  (e) The metal layer comprises copper foil, copper alloy foil, stainless foil, aluminum or aluminum alloy foil, nickel or nickel alloy foil, tin or tin alloy foil.
  (f) The core substrate is laminated with a support substrate.
  (g) The support substrate comprises an insulation film with an adhesive.
  (h) The electrical insulation layer comprises a solder resist or a photo solder resist.
  (i) The metal electrode comprises a single layer of an elemental substance of gold, silver, copper, nickel, palladium, tin, rhodium, cobalt, or their alloy, or a stacked layer thereof.
  (j) The metal electrode comprises at least 5 μm or more copper or copper alloy plating, or 3 μm or more nickel or nickel alloy plating.

(2) According to another aspect of the invention, a method for fabricating an electronic device substrate comprises the steps of:
  forming an electrical insulation layer on one side of a metallic core substrate;
  forming an opening in the electrical insulation layer; and
  forming a metal electrode in the opening.

In the above invention (2), the following modifications and changes can be made.
  (a) The core substrate comprises a composite base material with a carrier layer, a release layer, and a metal layer stacked therein.
  (b) The core substrate comprises a composite base material with a carrier layer, a release layer, and a metal layer stacked therein, the composite base material being integral with a support substrate.
  (c) The support substrate comprises an insulation film with an adhesive.
  (d) The electrical insulation layer is bonded to the core substrate by coating or pressure-welding.
  (e) The electrical insulation layer comprises a solder resist or a photo solder resist.
  (f) The core substrate comprises any of copper foil, stainless foil, aluminum or aluminum alloy foil, nickel or nickel alloy foil, or tin or tin alloy foil.

(3) According to another aspect of the invention, an electronic device comprises:
an electronic component in which is included one or more electrodes for external connection;
one or more metal electrodes to which is mounted the electronic component for being electrically connected to the electrode, and which are formed to pass through the thickness of an electrical insulation layer around the electronic component; and
an insulative covering material that covers the surface of the electronic component and the metal electrode.

(4) According to another aspect of the invention, an electronic device comprises:
an electronic component;
a metal electrode provided in a region that is electrically connected to an electrode of the electronic component; and
an insulative covering material that covers the electronic component and having the metal electrode in a portion on its surface, wherein:
an electrical insulation layer is provided around the metal electrode in the surface of the insulative covering material.

In the above inventions (3) and (4), the following modifications and changes can be made.
(a) The metal electrode is connected to a solder ball.
(b) The metal electrode is electrically connected to the electrode of the electronic component with a metallic thin wire.
(c) The metal electrode is electrically connected to the electrode of the electronic component with a bump.

(5) According to another aspect of the invention, a method for fabricating an electronic device comprises the steps of:
mounting an electronic component to an electronic device substrate comprising, on a core substrate, an electrical insulation layer and one or more metal electrodes formed in the electrical insulation layer to pass through the thickness of the electrical insulation layer;
electrically connecting a particular electrode of the electronic component and the metal electrode;
covering, with an insulative covering material, at least an electrical connection portion of the electronic component and the metal electrode; and
removing the core substrate from the electronic device substrate.

In the above invention (5), the following modifications and changes can be made.
(a) The step of removing the core substrate from the electronic device substrate is performed by chemical dissolution, electrochemical dissolution, mechanical grinding, or a combination thereof.
(b) When the core substrate comprises plural layers with a release layer inserted therein, the step of removing the core substrate from the electronic device substrate comprises releasing the front side of the core substrate from the surface of the release layer, thereafter removing the metal layer of the core substrate that remains in the electrical insulation layer, by chemical dissolution, electrochemical dissolution, mechanical grinding, or a combination thereof.

In the present invention, the electronic component contains, besides an IC, each chip component, such as a capacitor, a transistor, a diode, an electrical filter, etc.

ADVANTAGES OF THE INVENTION

According to the present invention, in the electronic device substrate and the electronic device, it is possible to reduce device size without applying stress to a package, as the core substrate is released from the electronic device substrate side with weak force. Further, in the methods for fabricating an electronic device substrate and an electronic device, it is possible to reduce the load of chemical or electrochemical dissolution, or mechanical grinding for exposing a terminal surface to a lower surface.

BRIEF DESCRIPTION OF THE DRAWINGS

The preferred embodiments according to the invention will be explained below referring to the drawings, wherein:
FIG. 5 is a cross-sectional view showing an electronic device substrate according to a first embodiment of the present invention;
FIGS. 10A-10G are a process diagram showing a fabrication method of the electronic device substrate according to the third embodiment of FIG. 9;
FIGS. 11A-11G are a process diagram showing a fabrication method of an electronic device according to a fourth embodiment of the present invention using the electronic device substrate according to the third embodiment shown in FIG. 9;
FIGS. 12A-12H are a process diagram showing a fabrication method of the electronic device substrate according to a fifth embodiment of the present invention;
FIG. 15 is a cross-sectional view showing an electronic device substrate according to a seventh embodiment of the present invention;
FIGS. 16A-16H are a process diagram showing a fabrication method of the electronic device substrate according to the seventh embodiment of the present invention;
FIGS. 17A-17G are a process diagram showing a fabrication method of an electronic device using an electronic device substrate according to an eighth embodiment.

DETAILED DESCRIPTION OF THE PREFERRED EMBODIMENTS

Figure 1A:
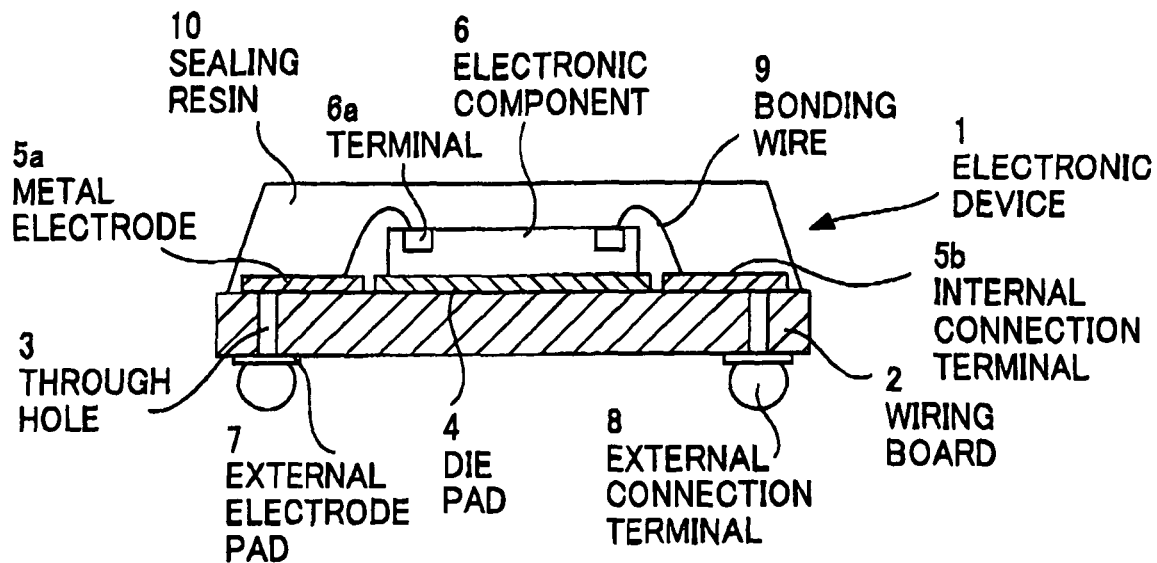
FIGS. 1A and 1B are respectively a front cross-sectional view and a plan view showing an electronic component mount surface of a conventional electronic device.
Figure 1B:
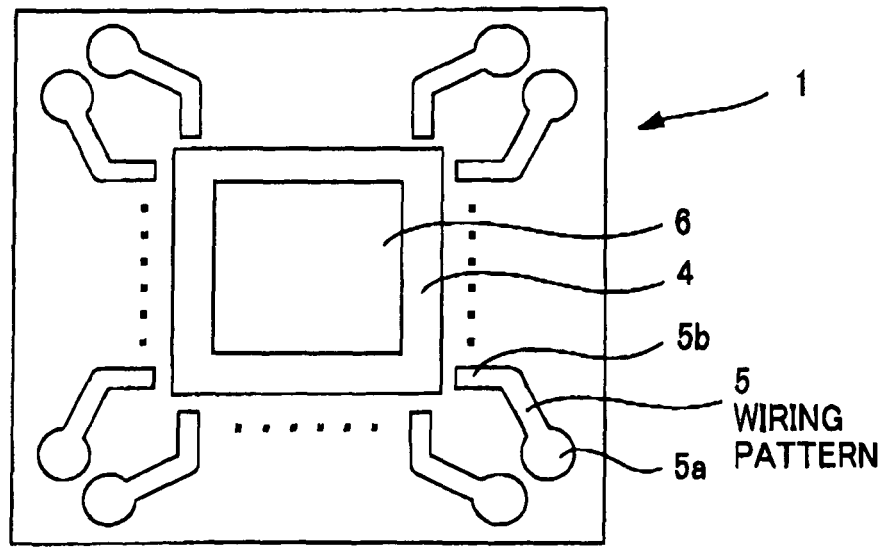
Figure 2:
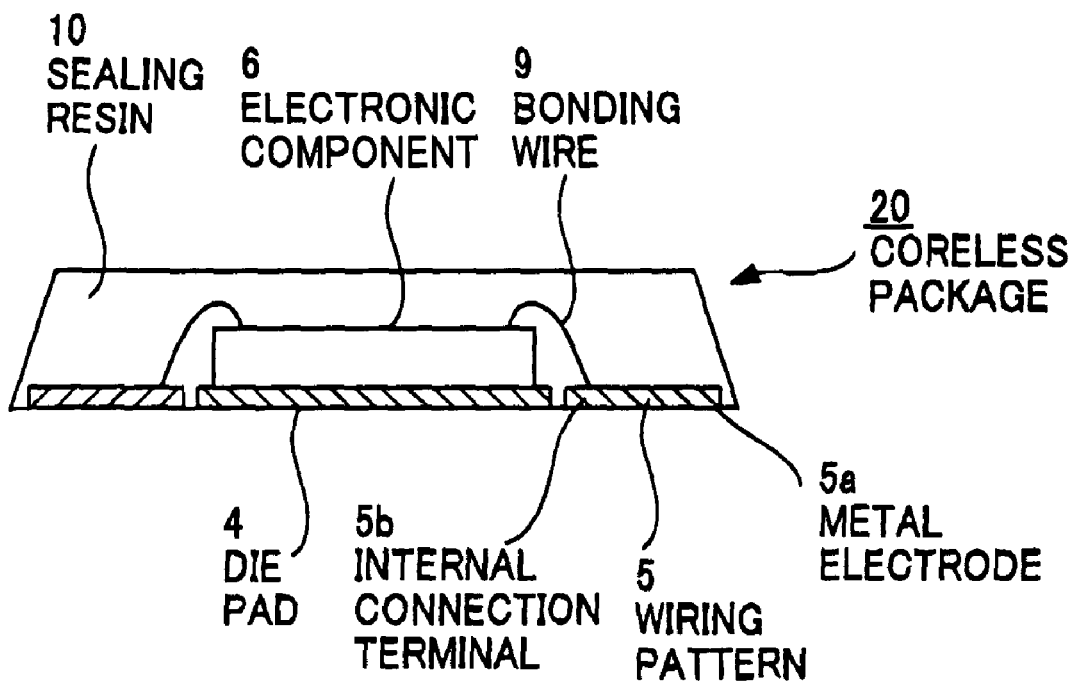
FIG. 2 is a cross-sectional view showing structure of a coreless electronic device.
Figure 3A:
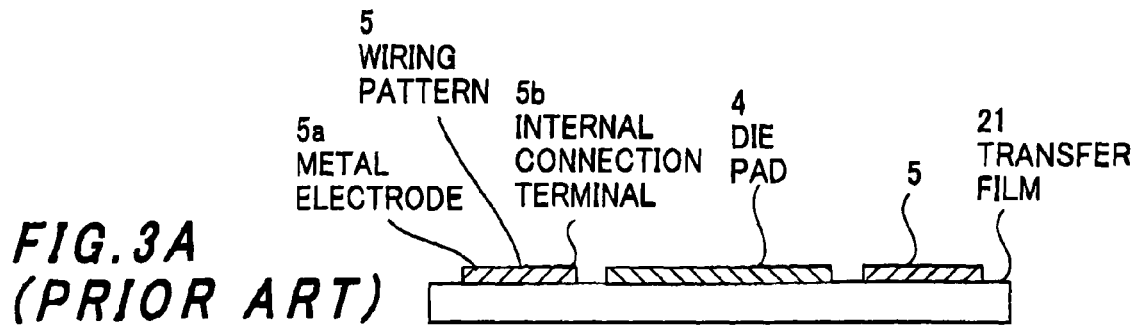
FIGS. 3A-3E are a process diagram showing a fabrication method of the coreless electronic device of FIG. 2.
Figure 3B:
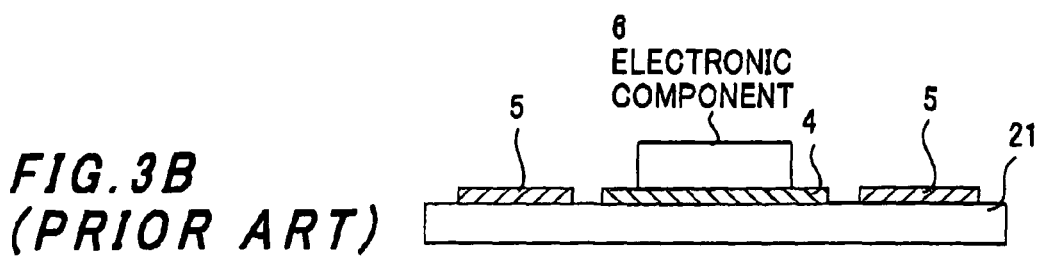
Figure 3C:
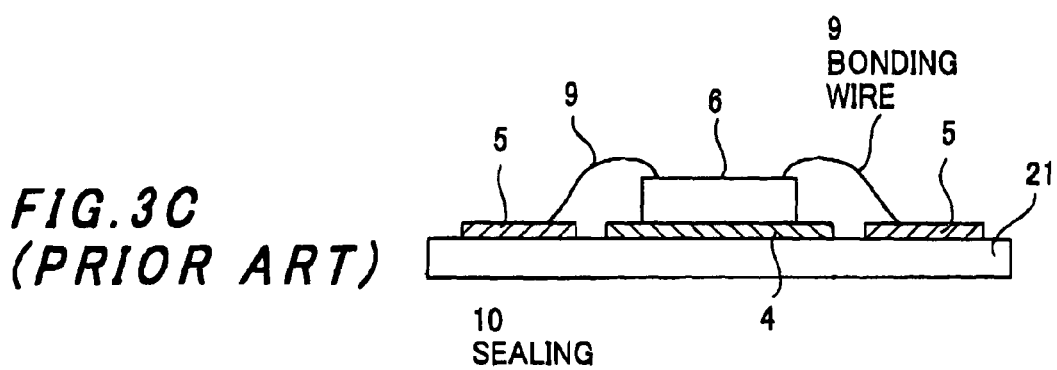
Figure 3D:
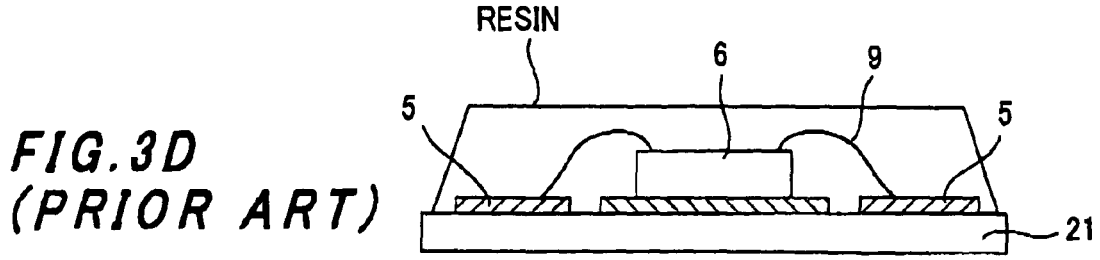
Figure 3E:
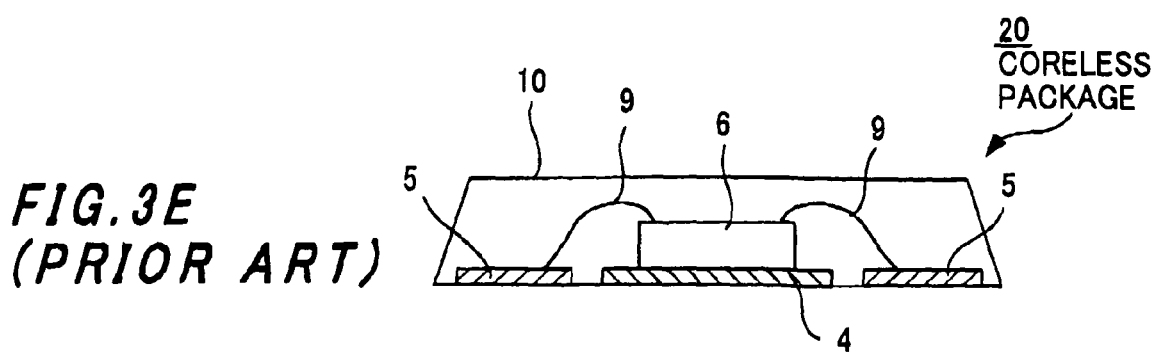
Figure 4:
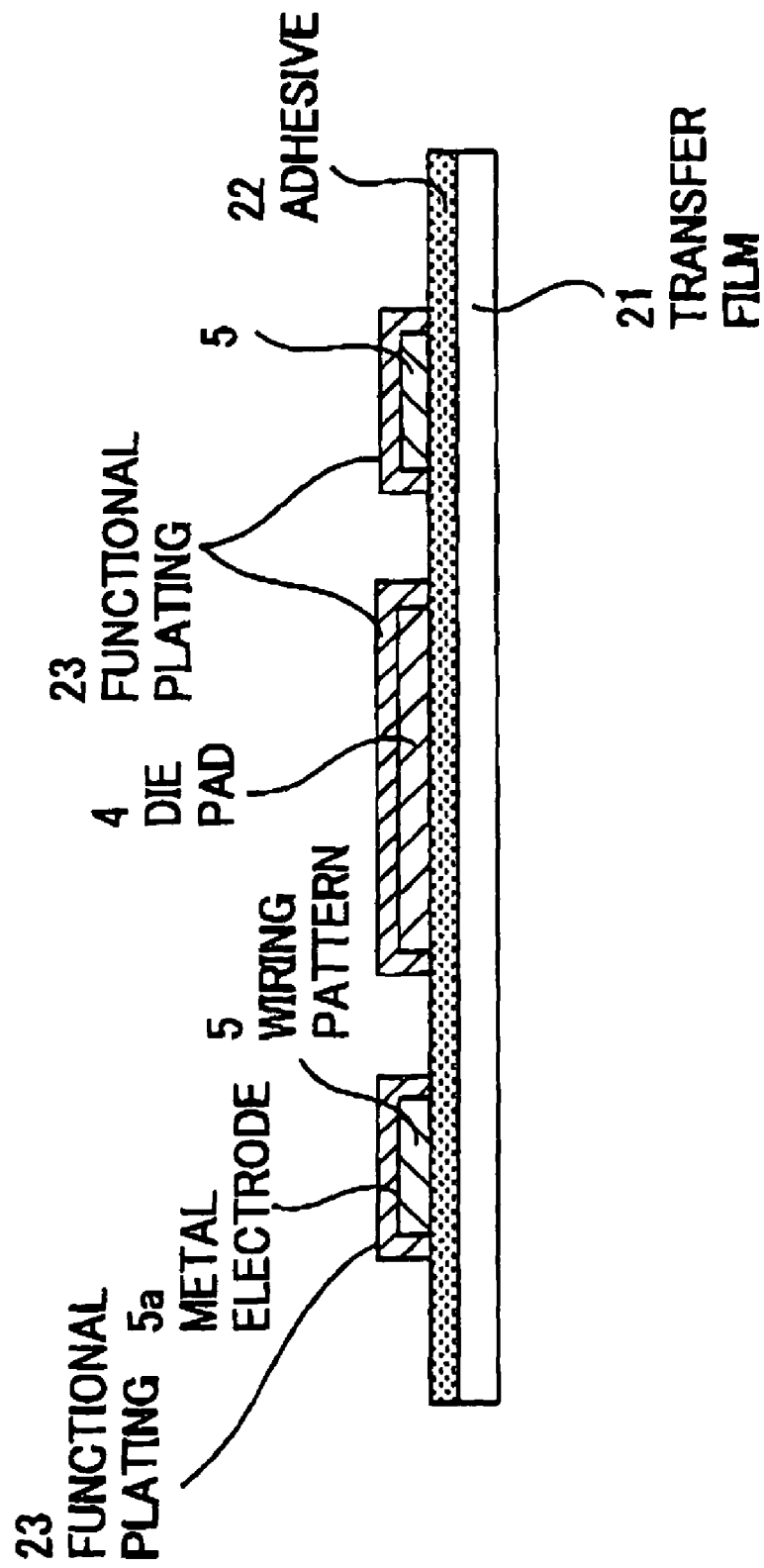
FIG. 4 is a cross-sectional view showing structure of a transfer film of FIG. 3.

FIG. 5 shows an electronic device substrate according to a first embodiment of the present invention. This electronic device substrate 100 comprises a core substrate 101 formed of copper foil as base material, a photo solder resist (hereinafter, "PSR") film 102 as a first electrical insulation layer formed in a specified pattern on the core substrate 101, a first plating film 104 provided in an opening 103 formed in a specified position of the PSR film 102, a second plating film 105 provided on the first plating film 104, and a third plating film 106 provided on the second plating film 105.

From the points of view of availability, cost, high electrical conductivity, and removability in a final step, the core substrate 101 most preferably comprises copper foil, but may comprise stainless foil, aluminum or aluminum alloy foil, nickel or nickel alloy foil, tin or tin alloy foil.

The core substrate 101 needs to be 20 μm or more thick because mechanical durability is required in carrying and fabrication. On the other hand, when it is used in an electronic device, the core substrate 101 needs to be finally removed, in which case the thick core substrate 101 requires the long processing time even in chemical dissolution, or mechanical grinding. To solve this, the core substrate 101 is reinforced with the PSR film 102, and to reduce the time of dissolution or grinding, the core substrate 101 uses e.g., 12 μm thick copper foil for ensuring mechanical durability and reduction of removal time.

The PSR film 102 uses an organic resist film such as an insoluble solder resist or a photo solder resist.

The first plating film 104 suitably uses gold, silver, palladium, nickel, tin or solder plating for solder packaging. Also, in the case of pressure weld packaging with an anisotropic conductive film (ACF), anisotropic conductive paste (ACP), non-conductive film (NCF), or non-conductive paste (NCP), the first plating film 104 suitably uses gold, silver, palladium, or nickel.

The second plating film 105 is provided as a barrier layer for preventing diffusion of tin in the solder into the gold, and uses nickel.

The third plating film 106 is provided for electrical connection to an electrode of an electronic component. The third plating film 106 can use gold, silver, and palladium. When an electronic component with a gold bump or a solder bump formed therein is flip-chip-connected, gold, tin, palladium and solder plating are required.

The combination of the first, second, and third plating films 104-106 constitutes a metal electrode 110, which serves as a wiring pattern in the electronic device. And the thickness of the metal electrode 110 and the PSR film 102 is 30 μm or less for making the electronic device thin.

Next, there will be explained a fabrication method of the electronic device substrate according to the first embodiment. FIGS. 6A-6G show a fabrication method of the electronic device substrate of FIG. 5.

Figure 6A:
FIGS. 6A-6G are a process diagram showing a fabrication method of the electronic device substrate of FIG. 5.
Figure 6B:
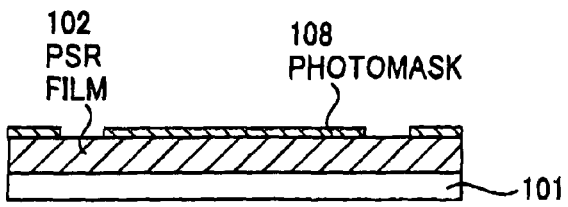

First, as shown in FIG. 6A, a 12 μm thick, 61 mm wide electrolytic copper foil is prepared as a core substrate 101. Next, as shown in FIG. 6B, a 15 μm thick PSR film 102 is formed over the core substrate 101 as a first electrical insulation layer by screen printing, dispensing, inkjet, etc. A photomask 108 is formed over the PSR film 102 for forming openings.

The thickness of the metal electrode 110 is substantially the same as that of the PSR film 102, but may be lower than that of the PSR film 102, thereby allowing reducing plating time when the metal electrode 110 is made by plating. Also, the PSR film 102 enhances mechanical durability of the entire substrate, so that mechanical durability in the electronic device manufacturing process can be obtained even in the case of a 20 μm or less core substrate 101.

Figure 6C:
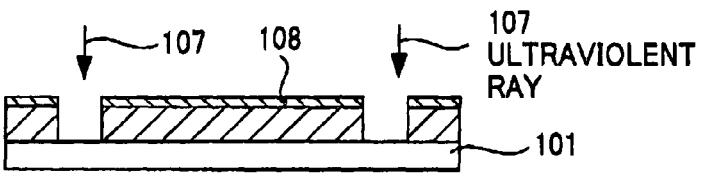
Figure 6D:
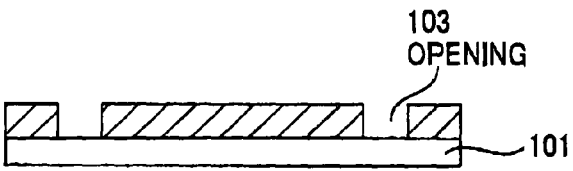

Next, as shown in FIG. 6C, the PSR film 102 is irradiated with ultraviolet rays 107 via the photomask 108. As shown in FIG. 6D, this is followed by development and formation of openings 103 in a desired shape on the PSR film 102.

In the case of a dry film type of the PSR film 102, releasing a protective tape provided on one side of the PSR film 102, the PSR film 102 is bonded to the core substrate 101 by roll lamination, which may, in the same way as a liquid PSR, be followed by light exposure, development and formation of openings 103.

Figure 6E:
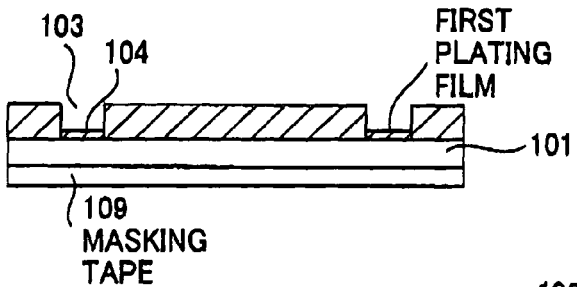

Next, after the surface with the PSR film 102 applied thereto and the lower surface (exposed surface) of the core substrate 101 are protected with a plating-resistant chemical electrical insulation tape (masking tape) 109, the entire substrate is immersed in an electrical gold plating liquid for forming a first plating film 104, and as shown in FIG. 6E, using the core substrate 101 as a cathode, a 0.5 μm thick gold plating film is applied to the opening as a first plating film 104.

Figure 6F:
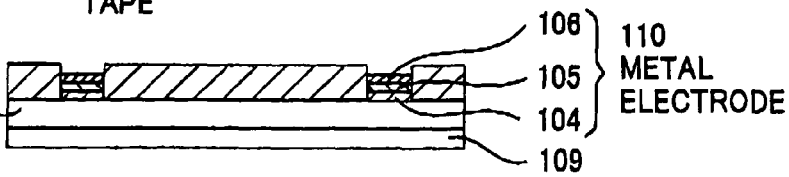
Figure 6G:
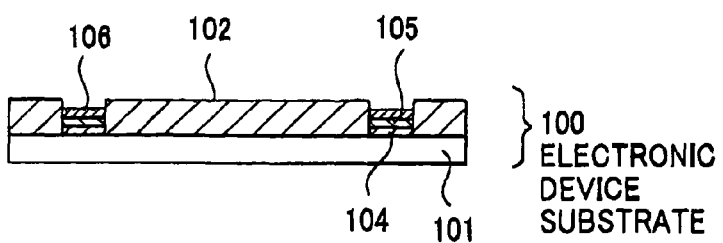

Next, by immersion in an electrical nickel plating liquid, a 1 μm thick nickel plating film is applied to the first plating film 104 as a second plating film 105, immediately followed by immersion in an electrical gold plating liquid, and as shown in FIG. 6F, a 0.5 μm thick gold plating film is applied to the second plating film 105 as a third plating film 106, which results in a metal electrode 110. Finally, the masking tape 109 is released from the core substrate 101, followed by sufficient water washing and subsequent drying, which results in an electronic device substrate 100, as shown in FIG. 6G.

The first embodiment exhibits the following advantages:
(a) Since the first plating film is applied in the substrate fabrication process, plating can be unnecessary in the electronic device fabrication process.
(b) Since the PSR film 102 and the metal electrode 110 are as thin as 30 μm or less, microfabrication can easily be performed to provide a small-size and thin electronic device whose thickness and projection area are both slightly larger than the size of an electronic component to be mounted.
(c) Since it is not necessary to form a micro-pattern by copper foil etching, resist coating, exposure, development and etching for photoetching can be unnecessary.
(d) Since the PSR film 102 for providing openings 103 is not dissolved and removed after plating, there is no concern for pollution due to a release liquid, and in addition, it is possible to substantially reduce time and therefore cost in the substrate fabrication process.
(e) Since the insoluble solder resist or photo solder resist is used as the PSR film 102 in the fabrication method, there is no concern for pollution due to a release liquid, and in addition, no dissolution and removal of the resist film for plating is required, which makes it possible to reduce time and therefore cost in the substrate fabrication process.

Figure 7:
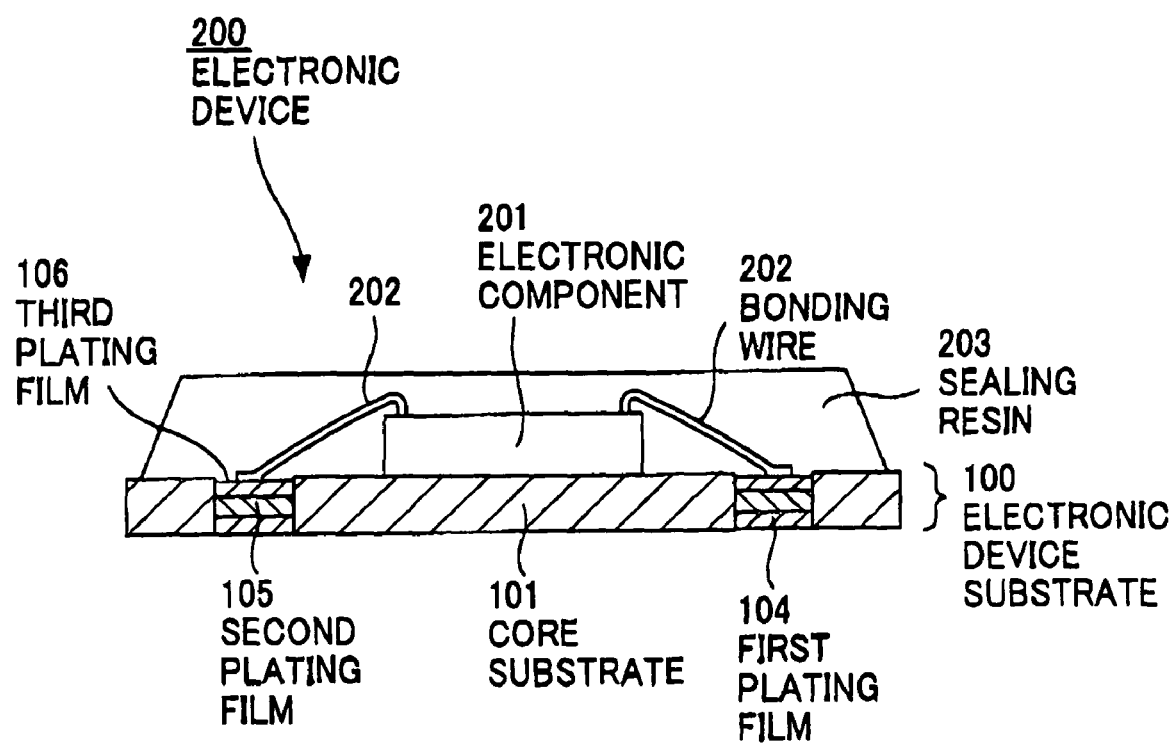
FIG. 7 is a cross-sectional view showing an electronic device according to a second embodiment of the present invention.

FIG. 7 shows an electronic device according to a second embodiment of the present invention. This electronic device 200 comprises the electronic device substrate 100 shown in the first embodiment, an electronic component 201 mounted in a specified position on the electronic device substrate 100, bonding wires 202 for connecting an external connection terminal not shown on the electronic component 201 and the third plating film 106 of the electronic device substrate 100, and a sealing resin 203 as insulative covering material covered on the electronic device substrate 100 for covering the electronic component 201, bonding wires 202, and third plating film 106.

Next, there will be explained a fabrication method of the electronic device of FIG. 7 according to the second embodiment. FIGS. 8A-8E show a fabrication method of the electronic device of FIG. 7.

Figure 8:
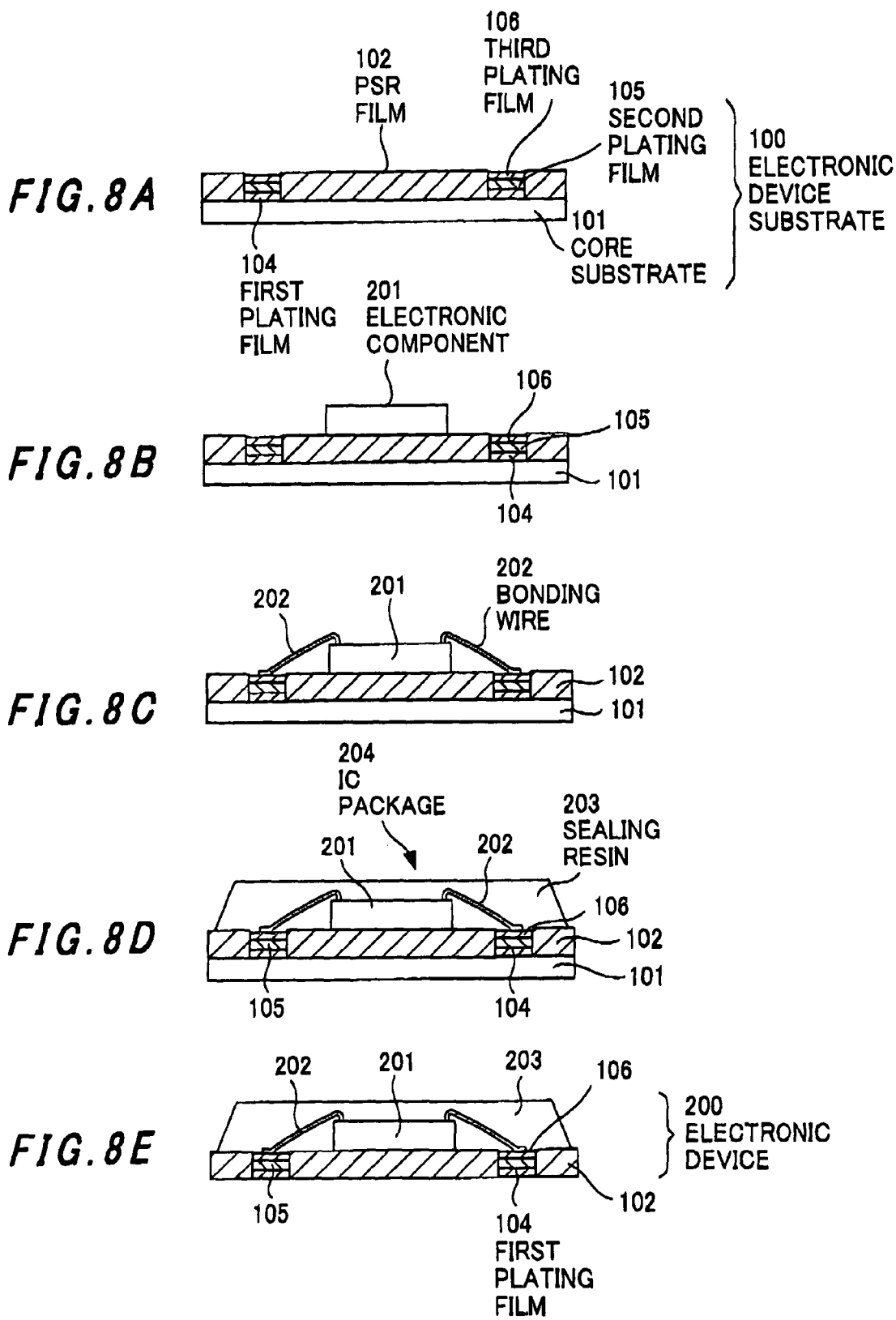
FIGS. 8A-8E are a process diagram showing a fabrication method of the electronic device of FIG. 7.

There is first prepared an electronic device substrate 100 as shown in FIG. 8A. Next, as shown in FIG. 8B, after an electronic component (IC chip) 201 having an aluminum electrode terminal not shown on a top surface is bonded with a die bonding paste to a coated surface of the PSR film 102 of the electronic device substrate 100, the aluminum electrode terminal of electronic component 201 and the third plating film 106 are electrically connected to each other with metallic bonding wires 202, as shown in FIG. 8C.

Next, this is followed by sealing resin 203 sealing for covering the electronic component 201, bonding wires 202, and third plating film 106 for protecting the electronic component 201 and bonded portions from external environment, as shown in FIG. 8D.

Next, a ferric chloride solution is sprayed to the core substrate (copper foil) 101 in the lower surface of an IC package 204, to chemically dissolve and remove the core substrate 101, as shown in FIG. 8E. The etching of this core substrate 101 is performed until the first plating film 104 is exposed from the surface opposite a resin sealed surface. This first plating film 104 also serves as an etching stopper of the core substrate 101. The above steps result in a coreless package electronic device 200 in which there is no core substrate by removal of the core substrate from the package.

The thickness of the core substrate 101 is as thin as 20 μm or less. The core substrate 101 serves as a reinforcement of the PSR film 102. Since the thickness of the metal to be removed by chemical dissolution or mechanical grinding is 20 μm or less from the beginning, the load applied in this removal can be substantially reduced.

For the electronic device thus completed, testing the exposed metal electrode 110 with an adhesion strength testing tape (3M Company, No. 56: adhesion-to-steel strength=5.5 N/10 mm) verifies that no releasing of the metal electrode 110 occurs, and the metal electrode 110, the thickness of which is as ultra-thin as about 2 μm, is firmly bonded to the sealing resin 203, which is the second electrical insulation layer, by reinforcement of the PSR film 102, which is the first electrical insulation layer.

The second embodiment exhibits the following advantages:
(a) Since the core substrate 101 to be finally removed is thin metal foil and is removed by chemical dissolution or mechanical grinding, no residue of the adhesive remains on the electronic device side metal electrode, and no film tearing occurs in the case of the film core substrate 101.
(b) Since the PSR film 102 arranged on the side of the metal electrode 110 increases bond strength of the sealing resin 203 covering the periphery of the metal electrode 110 and the electronic component 201, and serves as a reinforcement of the PSR film 102 for enhancing mechanical durability during the electronic device manufacturing process, a thin but high mechanical-strength electronic device can be fabricated.
(c) Since dissolution or mechanical removal of the backside thin metal foil exposes the lower surface of the first plating film 104 applied to the resist film, no plating of the electronic component terminal is required in the subsequent step.
(d) Since both the photo-etching and terminal plating can be omitted, the manufacturing time and therefore manufacturing cost can be substantially reduced.

Figure 9:
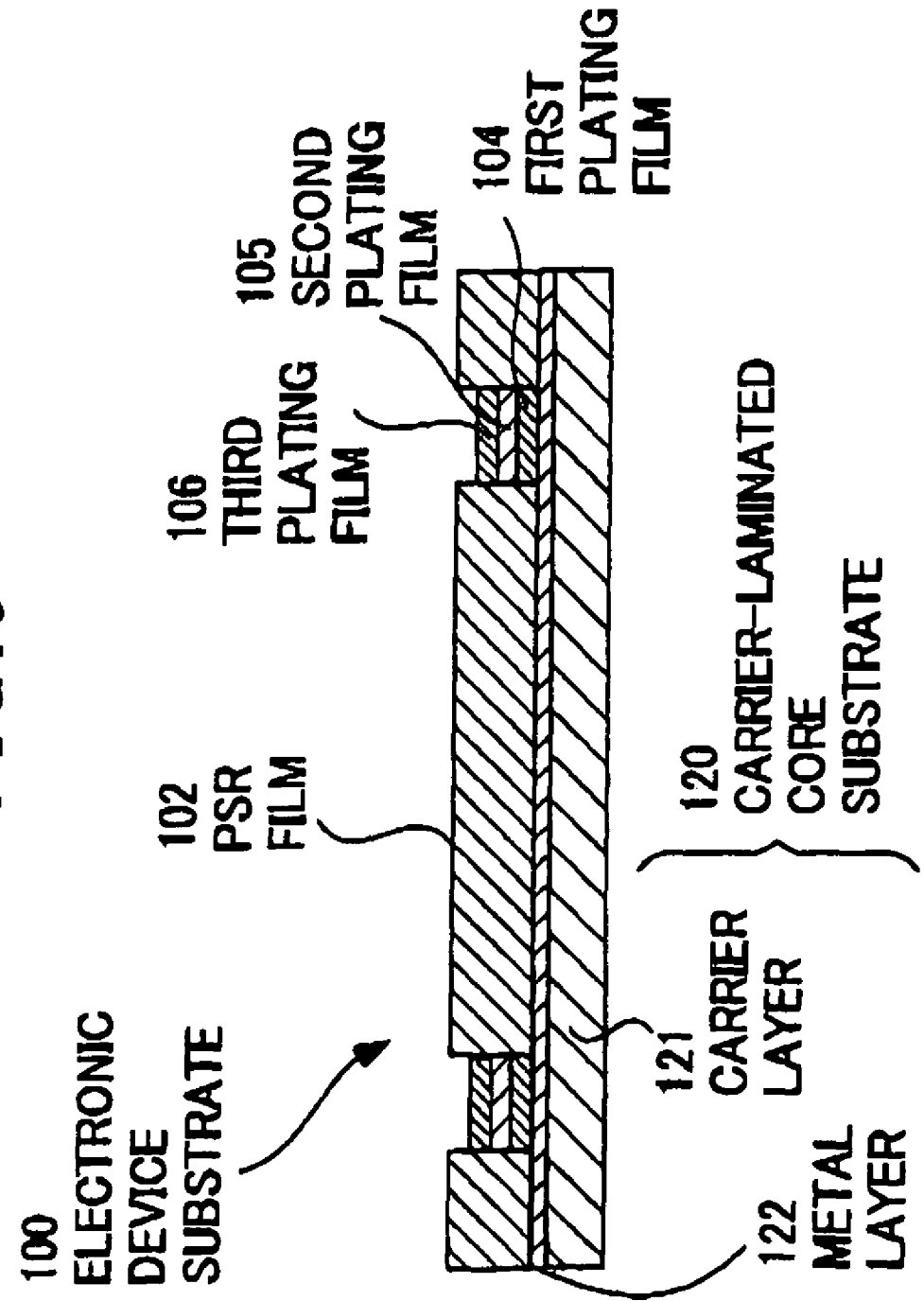
FIG. 9 is a cross-sectional view showing an electronic device substrate according to a third embodiment of the present invention.

FIG. 9 shows an electronic device substrate according to a third embodiment of the present invention. This electronic device substrate 100 uses a carrier-laminated metal foil (copper foil) as the core substrate that is the base material in the first embodiment, in which the other configuration is the same as in the first embodiment. This embodiment uses as the base material the carrier-laminated core substrate 120, in which a metal layer 122 formed of ultra-thin copper foil is deposited on a carrier layer (carrier copper foil) 121 having a release layer. The thickness of the metal layer 122 is thinner than the thickness of the carrier layer 121.

The carrier-laminated core substrate is the base material, in which, to provide thin metal foil (in many cases, copper foil), thin metal foil is formed by electrolysis after a release layer that has weak adhesion so as to be released in the subsequent step is formed in the carrier layer formed of metal foil (in many cases, copper foil) that is as thick as 18 μm or more. For instance, there is "CopperBond® Extra Thin Foil (XTF)" (Japan Olin Brass Corp.).

In addition to the above "CopperBond® Extra Thin Foil (XTF)" (Japan Olin Brass Corp.), as carrier-laminated metal foil, there is "MicroThin™" (Mitsui Mining & Smelting Co. Ltd.). The latter is base material that uses an organic release layer as the release layer, in which the other configuration is the same as in the former. In both, the metal layer 122 (ultra-thin copper foil) in the surface layer and carrier layer 121 with a thick base can be released from each other with a weak force of the order of 20 N/m. In particular, the former base material has an inorganic release layer, and is therefore easily releasable after heating at more than 400° C. The carrier-laminated ultra-thin copper foil with an organic release layer has the drawback that the heat-resistant temperature is as low as the order of 230° C. compared to inorganic release layer material.

The electronic device substrate 100 comprises 3 layer copper foil material in which an ultra-thin inorganic release layer with excellent heat resistance is produced by electrolysis on a carrier layer 121 formed of 18-35 μm thick rolled copper foil, followed by applying, to the top surface, a metal layer 122 formed of 5 μm or less, specifically 1-5 μm thick electrolytic copper foil. This configuration allows the carrier layer 121 and metal layer 122 to be more easily released from each other in the release layer portion with very weak releasing force.

This detail is shown in "DENSHI ZAIRYO", October, p. 76, KOGYO CHOSAKAI, 2004.

In removing metal layer 122 by electrochemical dissolution, first plating film 104 which remains on the electronic device side, and PSR film 102 which serves as the first insulating substance, must be insoluble. Taking account of soldering of this electronic device 200, first plating film 104 comprises a single layer of an elemental substance of gold, silver, copper, nickel, palladium, tin, rhodium, cobalt, or their alloy, or a stacked layer thereof, while the first insulating substance comprises a solder resist or a photo solder resist.

Next, there will be explained a fabrication method of the electronic device substrate according to the third embodiment. FIGS. 10A-10G show a fabrication method of the electronic device substrate 100 of FIG. 9.

First, a carrier-laminated core substrate 120 (FIG. 10A) is coated with a 15 μm thick PSR film 102 by screen printing, as shown in FIG. 10B. Next, as shown in FIG. 10C, using a photomask 108, the PSR film 102 is irradiated with ultraviolet rays 107 via the photomask 108. As shown in FIG. 10D, this is followed by development and formation of openings 103 in a desired shape on the PSR film 102.

Next, as shown in FIG. 10E, the surface of the carrier layer 121 is protected with a plating-resistant chemical electrical insulation tape (masking tape) 109, followed by immersion in an electrical gold plating liquid for forming a first plating film 104 and, using the core substrate 120 as a cathode, a 0.5 μm thick gold plating film is applied to the opening as a first plating film 104.

Next, by immersion in an electrical nickel plating liquid, a 1 μm thick nickel plating film is applied to the first plating film 104 as a second plating film 105, immediately followed by immersion in an electrical gold plating liquid, and as shown in FIG. 10F, a 0.5 μm thick gold plating film is applied to the second plating film 105 as a third plating film 106. Finally, the masking tape 109 is released from the carrier-laminated core substrate 120, followed by sufficient water washing and subsequent drying, which results in an electronic device substrate 100, as shown in FIG. 10G.

Use of the masking tape 109 increases cost. Solutions to improve this are as follows: For a plating method in which the carrier layer 121 is exposed, when the material is immersed in the plating liquid, the material is laminated with a vinyl chloride plate, bakelite plate, polycarbonate plate, or the like, or for continuous plating of the tape, the material is carried along the top surface of a vinyl chloride plate, etc., so that the plating liquid may thereby be prevented from flowing to the backside as much as possible.

According to the third embodiment, since the carrier layer 121 formed of thick copper foil is released from the metal layer 122, so that only the metal layer 122 formed of thin copper foil may thereby be the final substance to be removed, it is possible to reduce the load of chemical dissolution or mechanical grinding for exposing the metal electrode surface from a package backside, and to enormously facilitate operation.

Next, there will be explained a fabrication method of the electronic device according to a fourth embodiment. FIGS. 11A-11G show a fabrication method of an electronic device 200 using the electronic device substrate 100 according to the third embodiment shown in FIG. 9.

There is first prepared an electronic device substrate 100 as shown in FIG. 11A. Next, as shown in FIG. 11B, after an electronic component (IC chip) 201 is bonded and mounted with a die bonding paste to a top surface of the PSR film 102 of the electronic device substrate 100, an aluminum electrode terminal not shown of electronic component 201 and the third plating film 106 are electrically connected to each other with metallic bonding wires 202, as shown in FIG. 11C.

Next, as shown in FIG. 11D, this is followed by sealing resin 203 sealing for covering the electronic component 201 and bonding wires 202 for protecting the electronic component 201 and bonded portions from external environment.

Next, as shown in FIG. 11E, the carrier layer 121 is released from the IC package, to expose the metal layer 122, as shown in FIG. 1F. Since the carrier layer 121 formed of thick copper foil may be released with mechanically weak force, there remains the 1-5 μm ultra-thin metal layer 122 integral with the metal electrode 110 on the electronic device backside.

Next, a mixed solution of sulfuric acid and hydrogen peroxide is sprayed to the metal layer 122, to chemically dissolve and remove the metal layer 122. The etching of this metal layer 122 is performed until the first plating film 104 is exposed, as shown in FIG. 11G. This first plating film 104 also serves as an etching stopper of the metal layer 122. The above steps result in a coreless package electronic device 200 in which there is no core substrate by removal of the core substrate from the package.

As the method for removing the metal layer 122 after sealing resin 203 sealing, where the metal layer 122 comprises copper foil, it is possible to use a ferric chloride solution, copper chloride solution, sulfuric acid-hydrogen peroxide solution, sulfuric acid-peroxomonosulfuric acid potassium solution, sulfuric acid-peroxodisulfuric acid potassium solution, nitric acid solution, etc.

According to the fourth embodiment, since the carrier layer 121 formed of thick copper foil is released from the metal layer 122, so that only the metal layer 122 formed of thin copper foil may thereby be the final substance to be removed, it is possible to reduce the load of chemical dissolution or mechanical grinding for exposing the metal electrode surface from a package backside, and to enormously facilitate operation.

As a low-cost copper dissolution liquid whose waste water is easy to treat, a mixed solution of sulfuric acid and hydrogen peroxide is used in many cases. The copper dissolution velocity of this solution is generally 5-20 μm/min, which therefore allows 1-5 μm thick copper foil, which remains on the package backside, to be easily dissolved and removed in the short treatment time of the order of 10-60 sec.

The method for removing the metal layer 122 may also use chemical or electrochemical dissolution other than in this embodiment, or mechanical grinding, or a combination thereof.

FIGS. 12A-12H show a fabrication method of an electronic device substrate according to a fifth embodiment of the present invention. This embodiment shows another fabrication method of an electronic device substrate using as the core substrate the carrier-laminated core substrate 120 explained in the third embodiment.

There is first prepared a carrier-laminated core substrate 120. As shown in FIG. 12A, this carrier-laminated core substrate 120 includes an ultra-thin metal layer 122 deposited on a releasable carrier layer 121 formed of copper foil, and uses above-mentioned XTF (Japan Olin Brass Corp.).

As shown in FIG. 12B, a taping member 130 is prepared as a core substrate in which a polyimide tape 131 which serves as an insulating film is coated with 12 μm thick adhesive 132. As shown in FIG. 12C, this taping member 130 is superimposed on the carrier-laminated core substrate 120, which is passed between a pair of rolls 150A and 150B, to laminate the taping member 130 and the carrier-laminated core substrate 120 by roll lamination, which results in a base material 140. Here, "UPILEX® S" (thickness: 25 μm), UBE INDUSTRIES, LTD, is used as the polyimide tape 131, and "X SERIES" (comprising epoxy resin), Tomoegawa Paper Co., Ltd. as adhesive 132.

In this embodiment, the polyimide tape 131 with adhesive 132 is used because of its excellent heat and chemical resistance. Thus, any tape having such properties may be used in place of the polyimide tape 131.

The base material 140 comprises 5 layers of ultra-thin copper foil (metal layer 122: 1 μm)/release layer (about 100 Angst)/carrier copper foil (carrier layer 121: 35 μm)/adhesive 132 (12 μm)/support substrate (polyimide tape 131: 25 μm) from the surface layer.

By making the adhesive force between the release layer and carrier layer 121 smaller than the adhesive force between the release layer and metal layer 122, it is possible to mechanically release and remove the release layer, which occupies most of this substrate, and the carrier layer 121, or the carrier layer 121 and the polyimide tape 131, which serves as the support substrate. This release layer may be either an organic release layer or an inorganic release layer, which has the above adhesive force difference.

Further, the thickness of the metal layer 122 is 1-5 μm, taking account of ease of etching, and the composition of the metal layer 122 comprises any of copper and copper alloy foil, stainless foil, aluminum and aluminum alloy foil, nickel and nickel alloy foil, or tin and tin alloy foil.

Although as mentioned above, the thickness of the metal layer 122 is preferably 5 μm or less, it may be increased in case of insufficient strength for supporting the package side.

Next, as shown in FIG. 12D, the metal layer 122 of the base material 140 is coated with a 15 μm thick PSR film 102 which serves as the first electrical insulation layer, by screen printing. Next, as shown in FIG. 12E, the PSR film 102 is irradiated with ultraviolet rays 107 via a photomask 108. As shown in FIG. 12F, this is followed by development and formation of openings 103 in a desired shape on the PSR film 102.

Next, as shown in FIG. 12G, the base material 140 provided with the PSR film 102 is immersed in an electrical gold plating liquid for forming a first plating film 104 and, using the ultra-thin copper foil as a cathode, a 0.5 μm thick gold plating film is applied to the openings 103 as a first plating film 104.

Next, by immersion in an electrical nickel plating liquid, a 1 μm thick nickel plating film is applied to the first plating film 104 as a second plating film 105, immediately followed by immersion in an electrical gold plating liquid for applying a 0.5 μm thick gold plating film to the second plating film 105 as a third plating film 106. This is followed by sufficient water washing and subsequent drying, which results in an electronic device substrate 100.

The fifth embodiment exhibits the following advantages:
(a) Since the base material 140 has the carrier-laminated core substrate 120 laminated with the insulative and heat-resistant polyimide tape 131, no masking tape mounting is required during plating. For this reason, during masking tape releasing, the carrier layer 121 cannot be released together.
(b) Since the carrier layer 121 is joined to the polyimide tape 131 (support substrate) to serve as the support body during carrying in the fabrication process, it is possible to enhance mechanical durability of the electronic device substrate 100. Also, the polyimide tape 131 can serve as the support body during carrying in the fabrication process.

FIGS. 13A-13G show a fabrication method of an electronic device according to a sixth embodiment of the present invention, in which is shown the fabrication method of an electronic device 200 using the electronic device substrate 100 according to the fifth embodiment shown in FIG. 12.

Figure 13A:
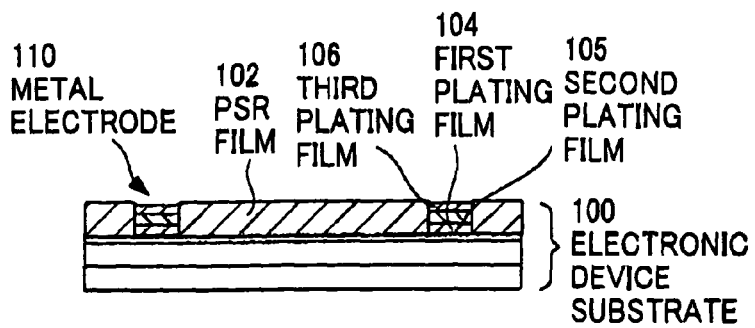
FIGS. 13A-13G are a process diagram showing a fabrication method of an electronic device according to a sixth embodiment of the present invention.
Figure 13B:
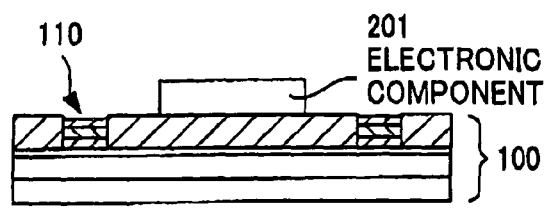
Figure 13C:
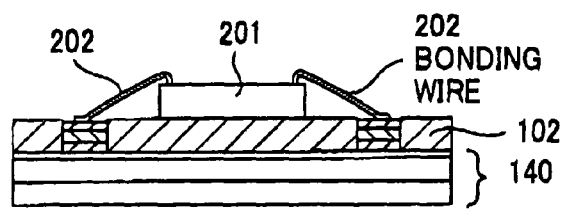

As shown in FIG. 13A, there is first prepared an electronic device substrate 100 produced with the method shown in FIG. 12. Next, as shown in FIG. 13B, after an electronic component (IC chip) 201 is bonded with a die bonding paste to a specified position in a top surface of the PSR film 102, an aluminum electrode terminal not shown of electronic component 201 and the third plating film 106 are electrically connected to each other with metallic bonding wires 202, as shown in FIG. 13C.

Figure 13D:
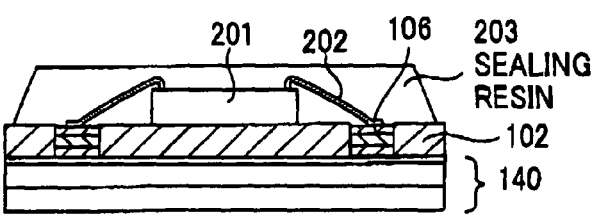
Figure 13E:
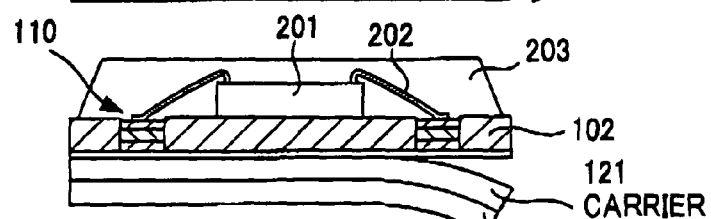
Figure 13F:
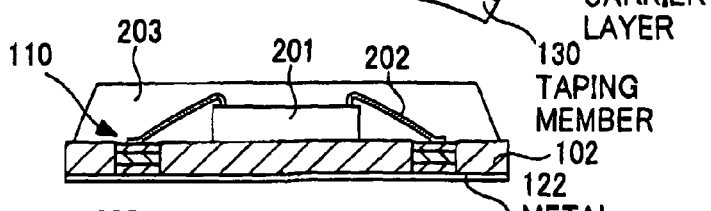

Next, as shown in FIG. 13D, this is followed by sealing resin 203 sealing for covering the electronic component 201, the bonding wires 202 and the third plating film 106 for protecting the electronic component 201 and the bonding wires 202 from external environment. Next, as shown in FIG. 13E, the taping member 130 and the carrier layer 121 are released together from the metal layer 122, to expose the metal layer 122, as shown in FIG. 13F.

Here, prior to releasing of the taping member 130 and the carrier layer 121, in FIG. 13D, the electronic device substrate 100 comprises 7 layers of sealing resin 203 or electronic component 201 and die bonding paste or bonding wires 202/ PSR film 102, or metal electrode layer (third plating film 106)/ultra-thin copper foil (metal layer 122)/release layer/ carrier copper foil (carrier layer 121)/adhesive 132/support substrate (polyimide tape 131), from the surface layer. In this, the adhesive force of the interface between the ultra-thin copper foil (metal layer 122) and the release layer is 20 N/m which is very weak compared to the adhesive force of the other interfaces, 1000 N/m or more. Accordingly, the polyimide tape 131, carrier layer 121 and release layer are released precisely so as to easily expose the surface of the ultra-thin copper foil (metal layer 122).

Figure 13G:
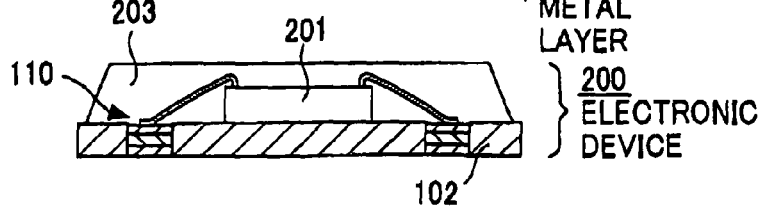

Next, a mixed solution of sulfuric acid and hydrogen peroxide is sprayed to the metal layer 122, to chemically dissolve and remove the metal layer 122. The etching of this metal layer 122 is performed until the first plating film 104 on the package backside is exposed, as shown in FIG. 13G. This first plating film 104 also serves as an etching stopper of the metal layer 122, as in the second embodiment. The above steps result in a coreless package electronic device 200 in which the external connection terminal does not project from the package.

Figure 14:
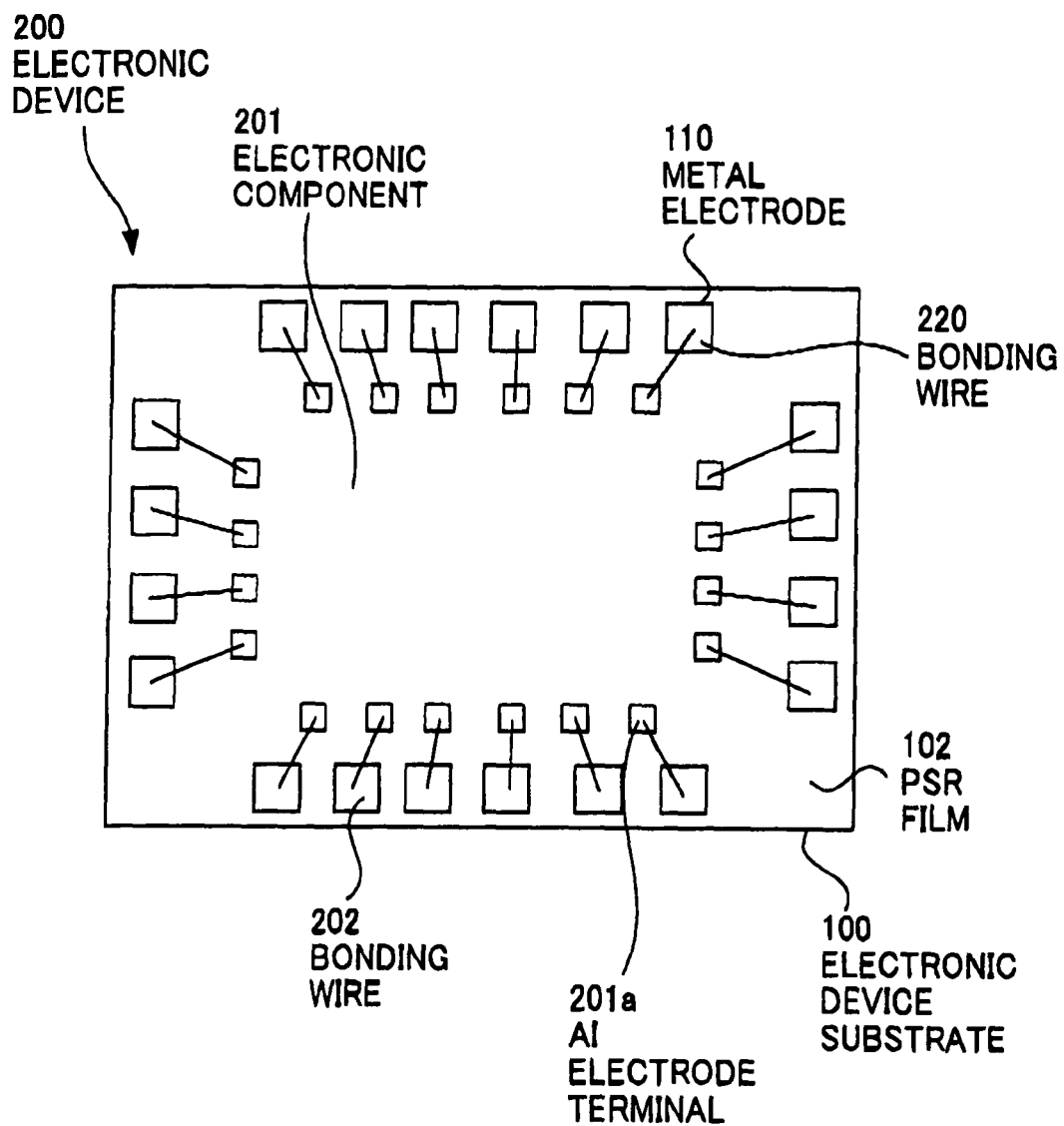
FIG. 14 is a plan view showing planar structure of the electronic device according to the sixth embodiment.

FIG. 14 shows planar structure of the electronic device according to the fifth embodiment. This electronic device 200 comprises an electronic component 201 mounted in a middle portion of an electronic device substrate 100, and plural metal electrodes 110 provided around the electronic component 201. Also, plural aluminum electrode terminals 201a are provided around the electronic component 201 as electrodes, and these aluminum electrode terminals 201a and metal electrodes 110 are connected to each other with bonding wires 202.

The sixth embodiment exhibits the following advantages:
(a) Since the relatively thick carrier-laminated core substrate 120 is further laminated with the polyimide tape 131, it is possible to enhance durability against mechanical stress during substrate fabrication and package assembly.
(b) Since no masking tape is used, it is possible to not only facilitate operation, but also prevent the relatively thick copper foil as the carrier from being released concurrently during masking tape releasing.

FIG. 15 shows an electronic device substrate according to a seventh embodiment of the present invention. This electronic device substrate 100 comprises a composite metal layer (composite copper foil) 160 comprising a metal layer 161 formed of copper foil as base material and with a release layer deposited thereon, and a thin metal film 162 further deposited on the release layer; a taping member 130 laminated on the composite metal layer 160 via adhesive 132 (see FIG. 16); a photo solder resist (PSR) film 102 as a first electrical insulation layer formed in a specified pattern on the metal layer 161; a first plating film 104 provided in an opening 103 formed in a specified position of the PSR film 102; a second plating film 105 provided on the first plating film 104; and a third plating film 106 provided on the second plating film 105.

From the points of view of availability, cost, high electrical conductivity, and removability in a final step, the metal layer 161 most preferably comprises copper foil, but may comprise stainless foil, aluminum or aluminum alloy foil, nickel or nickel alloy foil, tin or tin alloy foil.

The composite metal layer 160 needs to be 20 μm or more thick because mechanical durability is required in carrying and fabrication. On the other hand, when it is used in an electronic device, the metal layer 161 needs to be finally removed, in which case the thick metal layer 161 requires the long processing time even in chemical dissolution, or mechanical grinding. To solve this, the metal layer 161 is reinforced with the PSR film 102, and to reduce the time of dissolution or grinding, the metal layer 161 uses e.g., 12 μm thick copper foil for ensuring mechanical durability and reduction of removal time.

The PSR film 102 uses an organic resist film such as an insoluble solder resist or a photo solder resist.

The first plating film 104 suitably uses gold, silver, palladium, nickel, tin or solder plating for solder packaging. Also, in the case of pressure weld packaging with an anisotropic conductive film (ACF), anisotropic conductive paste (ACP), non-conductive film (NCF), or non-conductive paste (NCP), the first plating film 104 suitably uses gold, silver, palladium, or nickel.

The second plating film 105 is provided as a barrier layer for preventing diffusion of tin in the solder into the gold, and uses nickel or copper. For nickel, its thickness is desirably 3 μm or more, while for copper, its thickness is desirably 5 μm or more.

The reason for that is as follows: After package completion, the first plating film 104 exposed on the package backside is desirably formed of gold plating because of ease of packaging. However, gold-thermally diffuses very fast with tin, so that it immediately diffuses and vanishes during soldering. For that reason, if the second plating film 105 does not serve as a diffusion barrier with tin, the tin causes thermal diffusion of the second plating film, which reaches the third plating film 106. As a result, wire-bonding portion is polluted significantly. Thus the second plating film 105 needs to have thickness for preventing thermal diffusion of tin during packaging.

The thickness required for the second plating film 105 is determined by dissolution velocity (diffusion velocity) of each metal into fused solder. The solder packaging performance of the package requires reflow testing durability in which immersion in a solder bath at 260° C. for 10 sec is repeated 3 times or more. Specifically, the multiplied immersion time in the solder bath is 30 sec or more. Here, because the diffusion velocity of tin into nickel at 260° C. is 0.01 μm/s or less (see Tadashi Osawa, "HANDADUKE NO KISO TO OUYOU", 2000, KOGYO CHOSAKAI), the diffusion thickness for 30 sec immersion is on the order of 0.3 μm calculationally, but because the thin plating film has many pinholes, and serves insufficiently as the diffusion barrier film, forming a film with few pinholes requires 3 μm.

In the case of copper selected as the second plating film, the diffusion velocity of tin into copper at 260° C. is on the order of 0.1 μm/s (see the above-mentioned reference). Therefore the diffusion thickness for 30 sec immersion is on the order of 3 μm calculationally. For that reason, taking account of safety, 5 μm or more would be desirable.

The thickness of the second plating layer for serving as the diffusion prevention layer varies according to the number of times of reflow testing required. For example, in the case of durability of 6 times of 260° C. and 10 sec reflow testing, 3 μm is acceptable for nickel, but the order of 10 μm is required for copper.

The third plating film 106 is provided for electrical connection to an electrode of an electronic component. The third plating film 106 can use gold, silver, and palladium. When an electronic component with a gold bump or a solder bump formed therein is flip-chip-connected, gold, tin, palladium and solder plating are required.

In the case of use of copper plating in the second plating film 105, to prevent thermal diffusion of copper into the top surface, it is desirable that nickel of the order of 1 μm be plated on the copper, and then gold, silver, and palladium applied thereto.

The combination of the first, second, and third plating films 104-106 constitutes a metal electrode 110, which serves as a wiring pattern in the electronic device.

FIGS. 16A-16H show a fabrication method of the electronic device substrate according to the seventh embodiment of the present invention.

First, as shown in FIG. 16A, there is prepared a composite metal layer (composite copper foil) 160 comprising a metal layer 161 formed of 18 μm thick rolled copper foil and with a release layer deposited thereon, and a thin metal film 162 further deposited on the release layer. This composite metal layer 160 may use "CopperBond® Extra Thin Foil (XTF)" (Japan Olin Brass Corp.), for example.

Such composite copper foil is called carrier-laminated copper foil. The carrier-laminated core substrate is the base material, in which, to provide thin metal foil (in many cases, copper foil), thin metal foil is formed by electrolysis after a release layer that has weak adhesion so as to be released in the subsequent step is formed in the carrier layer formed of metal foil (in many cases, copper foil) that is as thick as 18 μm or more.

In addition to the above "CopperBond® Extra Thin Foil (XTF)" (Japan Olin Brass Corp.), as carrier-laminated metal foil, there is "MicroThin™" (Mitsui Mining & Smelting Co. Ltd.). The latter is base material that uses an organic release layer as the release layer, in which the other configuration is the same as in the former. In both, the metal layer 122 (ultrathin copper foil) in the surface layer and carrier layer 121 with a thick base can be released from each other with a weak force of the order of 20 N/m. In particular, the former base material has an inorganic release layer, and is therefore easily releasable after heating at more than 400° C. The carrier-laminated ultra-thin copper foil with an organic release layer has the drawback that the heat-resistant temperature is as low as the order of 230° C. compared to inorganic release layer material.

As shown in FIG. 16B, a taping member 130 is prepared in which a polyimide tape 131 is coated with adhesive 132. Here, "UPILEX® S" (thickness: 25 μm), UBE INDUSTRIES, LTD, is used as the polyimide tape 131, and "X SERIES" (comprising epoxy resin), Tomoegawa Paper Co., Ltd. as adhesive 132.

As shown in FIG. 16C, the polyimide tape 131 and composite metal layer 160 are laminated with adhesive 132 and metal film 162 facing each other by roll lamination, which results in a base material 140 comprising 5 layers of rolled copper foil (metal layer 161: 18 μm)/release layer (about 100 Angst)/ultra-thin copper foil (3 μm)/adhesive 132 (12 μm)/support substrate (polyimide tape 131: 25 μm) from the surface layer.

Next, as shown in FIG. 16D, the metal layer 161 of the base material 140 is coated with a 15 μm thick PSR film 102 which serves as the first electrical insulation layer, by screen printing. Next, as shown in FIG. 16E, the PSR film 102 is irradiated with ultraviolet rays 107 via a photomask 108. As shown in FIG. 16F, this is followed by development and formation of openings 103 in a desired shape on the PSR film 102.

Next, as shown in FIG. 16G, the substrate of FIG. 16F is immersed in an electrical gold plating liquid for forming a first plating film 104 and, using the ultra-thin copper foil as a cathode, a 0.5 μm thick gold plating film is applied to the openings 103 as a first plating film 104.

Next, as shown in FIG. 16H, by immersion in an electrical nickel plating liquid, a 5 μm thick nickel plating film is applied to the first plating film 104 as a second plating film 105, immediately followed by immersion in an electrical gold plating liquid for applying a 0.5 μm thick gold plating film to the second plating film 105 as a third plating film 106. This is followed by sufficient water washing and subsequent drying, which results in an electronic device substrate 100.

The seventh embodiment exhibits the following advantages:

(a) Since the base material 140 has the composite metal layer 160 laminated with the insulative and heat-resistant polyimide tape 131, no masking tape mounting is required during plating. For this reason, during masking tape releasing, the metal film 162 cannot be released together.

(b) Since laminating the metal film 162 of the composite metal layer 160 with the taping member 130 that serves as the support substrate maintains the thickness balance with the polyimide tape 131, it is possible to release and remove the polyimide tape very smoothly.

FIGS. 17A-17G show a fabrication method of an electronic device using an electronic device substrate according to an eighth embodiment.

First, an electronic component (IC chip) 201 is bonded with a die bonding paste to a specified position on a PSR film 102 of an electronic device substrate 100 shown in FIG. 17A explained in FIG. 16, as shown in FIG. 17B. Next, an aluminum electrode terminal not shown of the electronic component 201 and the third plating film 106 of the electronic device substrate 100 are electrically connected to each other with metallic bonding wires 202, as shown in FIG. 17C.

Next, as shown in FIG. 17D, this is followed by sealing resin 203 sealing for covering the electronic component 201, the bonding wires 202 and the third plating film 106 for protecting the electronic component 201 and bonded portions from external environment. Next, as shown in FIG. 17E, the taping member 130 and the metal layer 160 are released together from the metal layer 161, to expose the metal layer 161, as shown in FIG. 17F.

In FIG. 17D, the electronic device substrate 100 comprises 7 layers of sealing resin 203 or electronic component 201 and die bonding paste or bonding wires 202 (metallic wires)/PSR film 102 or third plating film 106/rolled copper foil (metal layer 161)/release layer/ultra-thin copper foil (metal film 162)/adhesive 132/support substrate (polyimide tape 131), from the surface layer. In this, the adhesive force of the interface between the rolled copper foil (metal layer 161) and the release layer is 20 N/m which is very weak compared to the adhesive force of the other interfaces, 1000 N/m or more. Accordingly, the polyimide tape 131, metal film 162 and release layer are released precisely so as to easily expose the surface of the rolled copper foil (metal layer 161).

Next, a mixed solution of sulfuric acid and hydrogen peroxide is sprayed to the metal layer 161, to chemically dissolve and remove the metal layer 161. The etching of this metal layer 161 is performed until the first plating film 104 is exposed, as shown in FIG. 17G. This first plating film 104 also serves as an etching stopper of the metal layer 161, as in the second embodiment. The above steps result in a coreless package electronic device 200 in which there is no core substrate by removal of the core substrate from the package. The planar structure of the electronic device 200 in this embodiment is shown in FIG. 14.

The eighth embodiment exhibits the following advantages:

(a) Since the composite metal layer 160 is further laminated with the heat-resistant taping member 130, it is possible to enhance durability against thermal mechanical stress during substrate fabrication and package assembly.

(b) Since during plating of the openings formed of the insulative substance applied to the relatively thick rolled copper foil surface, metal film 162 is laminated beforehand with the polyimide tape 131, no masking tape lamination is required. It is therefore possible to not only facilitate operation, but also prevent the ultra-thin copper foil from being released concurrently during masking tape releasing.

(c) Since the thickness balance of the composite metal layer 160 and the taping member 130 is maintained, it is possible to release and remove the polyimide tape 131 very smoothly.

(d) Although tin thermally diffuses immediately during gold soldering of the gold-plated electrode in the package lower surface, as the 3 μm or more nickel plating film is applied midway in plating configuration, the nickel in the intermediate layer serves as a tin diffusion barrier layer in the plural number of times of soldering. Since the 3 μm or more nickel plating prevents tin from reaching the top surface due to diffusion in the nickel even in the case of at least 7 times of repeated 260° C. and 30 sec reflow testing, no wire-bonded portions are damaged.

The eighth embodiment uses the 18 μm thick rolled copper foil as the metal layer 161, but may use therefor electrolytic copper foil, or other metal foil. Also, use of thinner metal foil makes it possible to reduce the load of removal by chemical dissolution or mechanical grinding.

Figure 18:
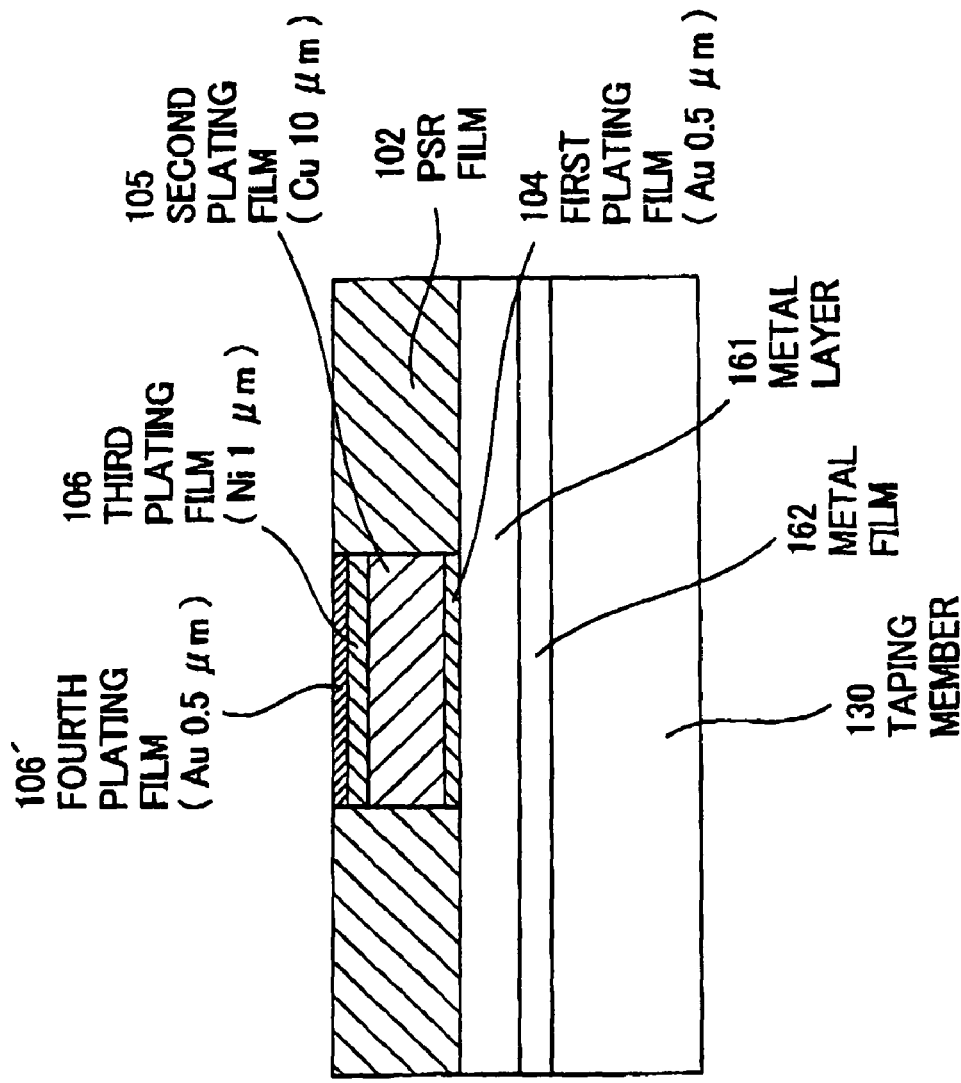
FIG. 18 is a schematic cross-sectional view showing an electronic device substrate according to a ninth embodiment of the present invention.

FIG. 18 shows an electronic device substrate according to a ninth embodiment of the present invention. The plating electrode configuration of the previous embodiment comprises 3 layers of gold/nickel/gold from the lowermost layer that serves as the electrode to be packaged on the package backside, but copper may practically be plated in place of the nickel. In this case, since the diffusion velocity of copper is 10-fold or more the diffusion velocity of nickel, the thickness required for barrier of diffusion with tin is increased.

FIG. 18 shows an example where copper is used as a second plating film. The fabrication method is substantially the same as in the seventh embodiment. Specifically, the steps of FIGS. 16A-16F provide an opening in a PSR film on a tape substrate using peelable copper foil as a base.

Next, the substrate of FIG. 16F is immersed in an electrical gold plating liquid for forming a first plating film 104 and, using the ultra-thin copper foil as a cathode, a 0.5 μm thick gold plating film is applied to the openings 103 as a first plating film 104, as shown in FIG. 16G.

Next, by immersion in an electrical copper plating liquid, a 10 μm thick copper plating film is applied to the first plating film 104 as a second plating film 105, followed by immersion in an electrical nickel plating liquid for applying a 1 μm thick nickel plating film to the second plating film 105 as a third plating film 106, immediately followed by immersion in an electrical gold plating liquid for applying a 0.5 μm thick gold plating film to the third plating film 106 as a fourth plating film 106'. This is followed by sufficient water washing and subsequent drying, which results in an electronic device substrate 100.

A schematic diagram of the plating film with this configuration is shown in FIG. 18. The plating configuration of this embodiment comprises 4 layers of gold (0.5 μm)/copper (10 μm)/nickel (1 μm)/gold (0.5 μm) from the lowermost layer that serves as the electrode to be packaged on the package backside.

According to the ninth embodiment, besides the advantages (a) and (b) of the seventh embodiment, since most of the wiring is formed with copper plating, the electrical and thermal conductivities are high, and the transmission properties of the wiring are excellent.

A process for assembling an electronic component using the tape substrate of the ninth embodiment, and its advantages are similar to those of the eight embodiment.

The invention is not limited to each embodiment above, but various modifications are possible within the range not departing from or altering the technical ideas of the invention.

In each embodiment above, a solder ball may be connected to the metal electrode 110. Further, the electronic component 201 and the third plating film 106 may be electrically connected to each other with solder bumps in place of wire bonding.

Although the metal electrode 110 is shown as comprising 3 layers of gold/nickel/gold assuming the soldering packaging of the wire bonding type package in each embodiment above, it is possible to freely combine a proper kind and thickness according to assembling methods of electronic component 201, particularly electrical connection methods of the component and substrate, and methods for packaging the assembled component onto a printed wiring board.

In each embodiment above, solder bumps may be attached to first plating film 104, to fabricate BGA (ball grid array) electronic device substrate 100 or electronic device 200. Also, the electrical connection of an electrode of electronic component 201 in electronic device 200, and metal electrode 110 may use connection using either of wire bonding, which connects the backside of electronic component 201 to electronic device substrate 100, followed by metallic thin wire connection, or a flip chip, which connects bumps to electronic component 201, followed by connection to electronic device substrate 100 via the bumps.

Although the example is shown in each embodiment above, in which there is one electronic component 201 mounted in one electronic device 200, the invention may be applied to a multi-chip package in which are mounted plural components. Further, the invention may be applied to an electronic device, in which plural components are placed in array in unit area, and collectively resin-sealed, followed by being diced in to small pieces each corresponding to unit component.

In each embodiment above, the electronic component may be a functional component, other than an IC chip, such as a capacitor, inductor, transistor, diode, MEMS, electrical filter, etc. to which the invention may be applied, as in the example of the IC chip.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method for fabricating an electronic device substrate, comprising:
    forming an electrical insulation layer on one side of a core substrate, the core substrate comprising a carrier layer, a release layer, and a metal layer stacked therein;
    forming an opening in the electrical insulation layer; and
    forming a metal electrode in the opening.

2. The method for fabricating an electronic device substrate according to claim 1, wherein:
    the core substrate comprises a composite base material comprising the carrier layer, the release layer, and the metal layer.

3. The method for fabricating an electronic device substrate according to claim 2, wherein:
    the composite base material is integral with a support substrate.

4. The method for fabricating an electronic device substrate according to claim 3, wherein:
    the support substrate comprises an insulation film with an adhesive.

5. The method for fabricating an electronic device substrate according to claim 1, wherein:
    the electrical insulation layer is bonded to the core substrate by coating or pressure-welding.

6. The method for fabricating an electronic device substrate according to claim 1, wherein:
    the electrical insulation layer comprises a solder resist or a photo solder resist.

7. The method for fabricating an electronic device substrate according to claim 1, wherein:
    the core substrate comprises any of copper foil, stainless foil, aluminum or aluminum alloy foil, nickel or nickel alloy foil, or tin or tin alloy foil.

8. The method for fabricating an electronic device substrate according to claim 1, wherein the release layer is located between the carrier layer and the metal layer.

9. The method for fabricating an electronic device substrate according to claim 1, wherein the release layer is an inorganic release layer.

10. The method for fabricating an electronic device substrate according to claim 1, wherein the release layer comprises copper.

11. The method for fabricating an electronic device substrate according to claim 10, wherein the release layer is 18-35 μm thick.

12. The method for fabricating an electronic device substrate according to claim 1, wherein the metal electrode comprises a substantially planar film.

13. The method for fabricating an electronic device substrate according to claim 1, wherein the metal electrode comprises a plurality of laminated plating films.

14. The method for fabricating an electronic device substrate according to claim 1, further comprising:
    using the metal layer as an electrode to form a plating film, wherein the metal electrode comprises the plating film.

* * * * *